US012660163B2

(12) United States Patent
Cho et al.

(10) Patent No.: US 12,660,163 B2
(45) Date of Patent: Jun. 16, 2026

(54) SEMICONDUCTOR DEVICE

(71) Applicant: SAMSUNG ELECTRONICS CO., LTD., Suwon-si (KR)

(72) Inventors: Byunghoon Cho, Suwon-si (KR); Namjung Kang, Suwon-si (KR); Kiheum Nam, Suwon-si (KR); Jihyun Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 400 days.

(21) Appl. No.: 18/374,870

(22) Filed: Sep. 29, 2023

(65) Prior Publication Data

US 2024/0179890 A1 May 30, 2024

(30) Foreign Application Priority Data

Nov. 24, 2022 (KR) ........................ 10-2022-0159186

(51) Int. Cl.
H10B 12/00 (2023.01)
(52) U.S. Cl.
CPC ......... H10B 12/315 (2023.02); H10B 12/482 (2023.02); H10B 12/50 (2023.02)
(58) Field of Classification Search
CPC .... H10B 12/315; H10B 12/482; H10B 12/50; H10B 12/033; H10B 12/0335; H10B 12/09; H10B 12/03; H10B 12/05; H10B 12/30; H10B 12/48; H10B 12/485
See application file for complete search history.

(56) References Cited

U.S. PATENT DOCUMENTS

| | | | |
|---|---|---|---|
| 9,508,722 B2 | 11/2016 | Hsu et al. | |
| 10,263,066 B2 * | 4/2019 | Hiroi | H10D 1/68 |
| 10,559,569 B2 | 2/2020 | Jang et al. | |
| 11,088,140 B2 | 8/2021 | Huang | |
| 11,201,155 B2 | 12/2021 | Lee et al. | |

(Continued)

FOREIGN PATENT DOCUMENTS

| KR | 10-1999-0063067 A | 7/1999 |
|---|---|---|
| KR | 10-2021-0089278 A | 7/2021 |

OTHER PUBLICATIONS

Notice of Allowance dated Mar. 19, 2026 issued in corresponding to Korean Patent Application No. 10-2022-0159186.

*Primary Examiner* — Thanh T Nguyen
(74) *Attorney, Agent, or Firm* — Morgan, Lewis & Bockius LLP

(57) ABSTRACT

A semiconductor device includes a peripheral circuit transistor disposed in a peripheral circuit region. First connection lines and second connection lines are disposed on a same plane above the peripheral circuit transistor. The second connection lines including a cutting portion. A cell capacitor is disposed on the substrate in a cell region. A first plate pattern is on the cell capacitor. A second plate pattern is on a portion of a surface of the first plate pattern. A first contact plug directly contacts an upper surface of the second plate pattern. A third connection line is disposed above the second connection line. The third connection line faces the cutting portion. Second contact plugs extend vertically to directly contact both sidewalls of the third connection line and upper surfaces of the second connection lines. The third connection line is disposed on a same plane as the second plate pattern.

20 Claims, 25 Drawing Sheets

(56)                References Cited

U.S. PATENT DOCUMENTS

| | | | |
|---|---|---|---|
| 11,245,019 | B2 | 2/2022 | Ahn et al. |
| 11,374,087 | B2 | 6/2022 | Kim |
| 2011/0117718 | A1 | 5/2011 | Nakamura et al. |
| 2017/0005100 | A1* | 1/2017 | Cho ...................... H01L 23/522 |
| 2021/0036101 | A1 | 2/2021 | Choi et al. |
| 2022/0157928 | A1 | 5/2022 | Kim |
| 2022/0336365 | A1* | 10/2022 | Lee ................... H01L 21/76885 |
| 2022/0344276 | A1* | 10/2022 | Kim ..................... H01L 23/528 |
| 2023/0045674 | A1* | 2/2023 | Jang ................... H10B 12/0335 |

* cited by examiner

SECOND
DIRECTION

FIRST
DIRECTION

SECOND
DIRECTION

FIRST
DIRECTION

SECOND
DIRECTION

FIRST
DIRECTION

SECOND
DIRECTION

FIRST
DIRECTION

FIG. 18

SECOND
DIRECTION

FIRST
DIRECTION

SEMICONDUCTOR DEVICE

CROSS-REFERENCE TO RELATED APPLICATION

This application claims priority under 35 USC § 119 to Korean Patent Application No. 10-2022-0159186, filed on Nov. 24, 2022, in the Korean Intellectual Property Office, the disclosure of which is incorporated by reference in its entirety herein.

1. TECHNICAL FIELD

The present disclosure relates to a semiconductor device, and more particularly, to a semiconductor device including a wiring structure.

2. DISCUSSION OF RELATED ART

A DRAM device may include a cell region on which memory cells are formed and a peripheral circuit region on which peripheral circuits for driving the memory cells are formed. The peripheral circuits may include transistors and wiring structures. The wiring structures may be arranged to have a relatively narrow width and a relatively narrow pitch. However, this increases the difficulty of a patterning process for forming the wiring structures.

SUMMARY

Embodiments of the present disclosure provide a semiconductor device including a wiring structure.

According to an embodiment of the present disclosure, a semiconductor device includes a substrate including a cell region and a peripheral circuit region. A peripheral circuit transistor is disposed in the peripheral circuit region. First connection lines and second connection lines are disposed on a same plane above the peripheral circuit transistor. The second connection lines including a cutting portion. A cell capacitor is disposed on the substrate in the cell region. The cell capacitor includes a lower electrode, a dielectric layer, and an upper electrode. A first plate pattern is on an upper electrode of the cell capacitor. A second plate pattern is on a portion of a surface of the first plate pattern. A first contact plug directly contacts an upper surface of the second plate pattern. A third connection line is disposed above the second connection line. The third connection line faces the cutting portion. Second contact plugs extend vertically to directly contact both sidewalls of the third connection line and upper surfaces of the second connection lines. The second contact plugs electrically connect the second connection lines and the third connection line to each other. The third connection line is disposed on the same plane as the second plate pattern.

According to an embodiment of the present disclosure, a semiconductor device includes a substrate including a cell region and a peripheral circuit region. Bit line structures are disposed on the substrate of the cell region. A lower contact structure is disposed between the bit line structures. The lower contact structure includes a lower contact plug and a landing pad stacked thereon. Peripheral circuit transistors are disposed in the peripheral circuit region. First connection lines and second connection lines are disposed on a same plane above the peripheral circuit transistor. The second connection lines include a cutting portion. A cell capacitor is disposed on the landing pad. The cell capacitor includes a lower electrode, a dielectric layer, and an upper electrode. A first plate pattern is on an upper electrode of the cell capacitor. A second plate pattern is on the first plate pattern. An entirety of a lower surface of the second plate pattern is higher than an uppermost surface of the upper electrode. A first contact plug directly contacts an upper surface of the second plate pattern. A third connection line is disposed above the second connection line. The third connection line faces the cutting portion. Second contact plugs extend vertically to directly contact both sidewalls of the third connection line and upper surfaces of the second connection lines. The second contact plugs electrically connect the second connection lines and the third connection line to each other. A bottom surface of the third connection line is coplanar with a bottom surface of the second plate pattern in a vertical direction.

According to an embodiment of the present disclosure, a semiconductor device includes a substrate including a cell region and a peripheral circuit region. Peripheral circuit transistors are disposed in the peripheral circuit region. First connection lines are disposed on a same plane above the peripheral circuit transistor. The first connection lines include a cutting portion. A cell capacitor is disposed on the substrate of the cell region. The cell capacitor includes a lower electrode, a dielectric layer, and an upper electrode. A plate pattern is on an upper electrode of the cell capacitor. An entirety of a lower surface of the plate pattern is higher than an uppermost surface of the upper electrode. A first contact plug directly contacts an upper surface of the plate pattern. A second connection line faces the cutting portion. The second connection line is positioned on a same plane as the plate pattern in a vertical direction. Second contact plugs extend to directly contact both sidewalls of the second connection line and upper surfaces of the first connection lines. The second contact plugs are electrically connected to the first connection lines and the second connection line.

In the semiconductor device according to the embodiments of the present disclosure, the second connection lines may include the cutting portion. Accordingly, the arrangement density of the first and second connection lines may be reduced so that the first and second connection lines may be easily patterned. Also, the cutting portion between second connection lines may be electrically connected to the second connection lines via the second contact plugs and third connection lines. The second contact plugs may be formed together in processes for forming the memory cells in the cell region, and the third connection lines may be formed together in processes for forming the memory cells in the cell region. Thus, additional processes for forming each of the second contact plugs and the third connection lines may not be required.

BRIEF DESCRIPTION OF THE DRAWINGS

Embodiments of the present disclosure will be more clearly understood from the following detailed description taken in conjunction with the accompanying drawings. FIGS. 1 to 25 represent non-limiting embodiments as described herein.

FIG. 1 is a cross-sectional view of a DRAM device according to an embodiment of the present disclosure.

FIG. 2 is a plan view illustrating a portion of a DRAM according to an embodiment of the present disclosure.

FIG. 3 is a block diagram illustrating first and second connection lines connected to bit line structures according to an embodiment of the present disclosure.

FIGS. 4, 6 to 8, 10 to 16, 18, 19 and 21 are cross-sectional views illustrating a method of manufacturing a DRAM device according to embodiments of the present disclosure.

FIGS. 5, 9, 17 and 20 are plan views illustrating a method of manufacturing a DRAM device according to embodiments of the present disclosure.

FIG. 22 is a cross-sectional view of a DRAM device according to an embodiment of the present disclosure.

FIGS. 23 to 25 are cross-sectional views illustrating a method for manufacturing a DRAM device according to embodiments of the present disclosure.

DETAILED DESCRIPTION OF EMBODIMENTS

Hereinafter, embodiments of the present invention will be described in detail with reference to the accompanying drawings.

Figure 1:
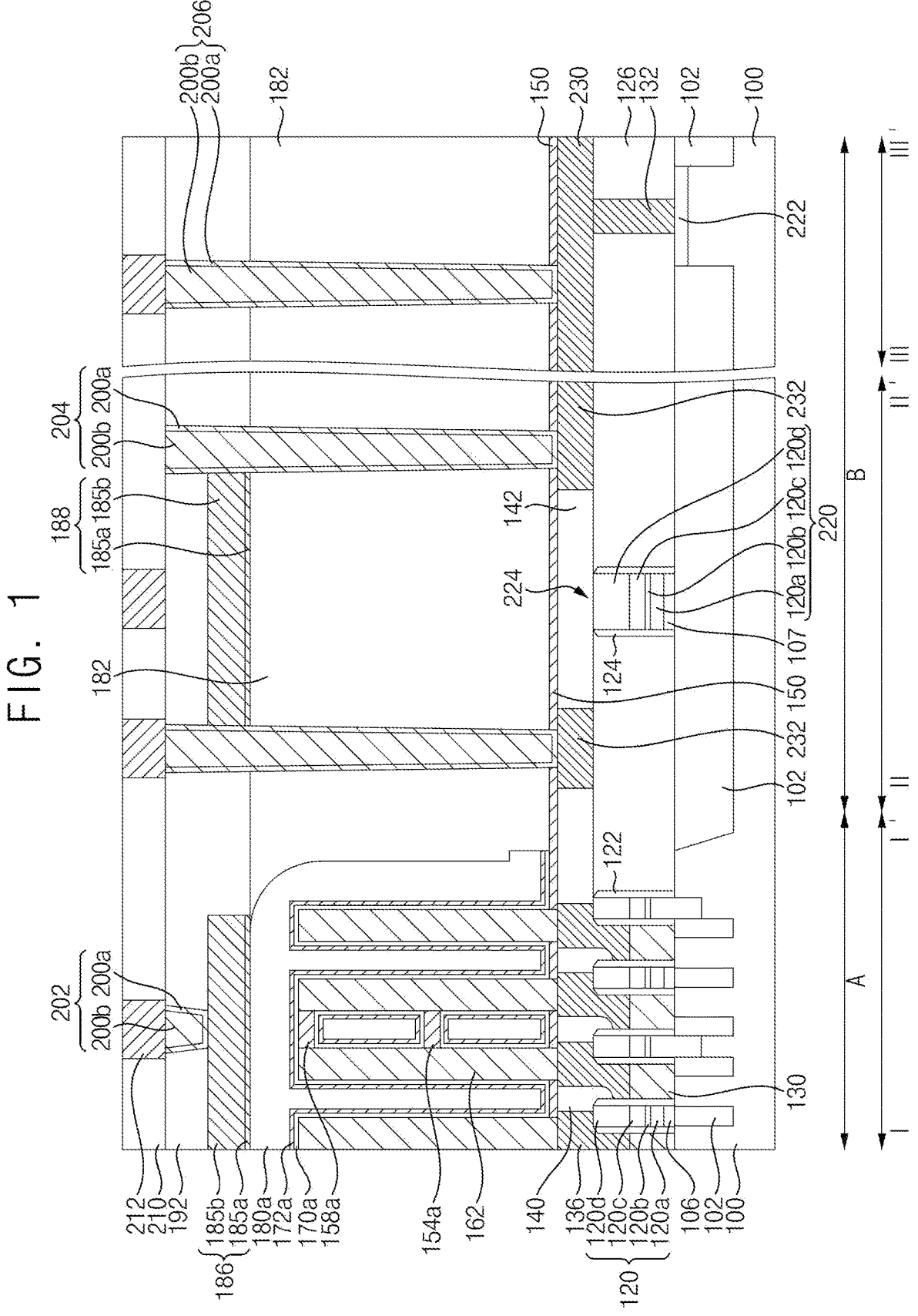
Figure 2:
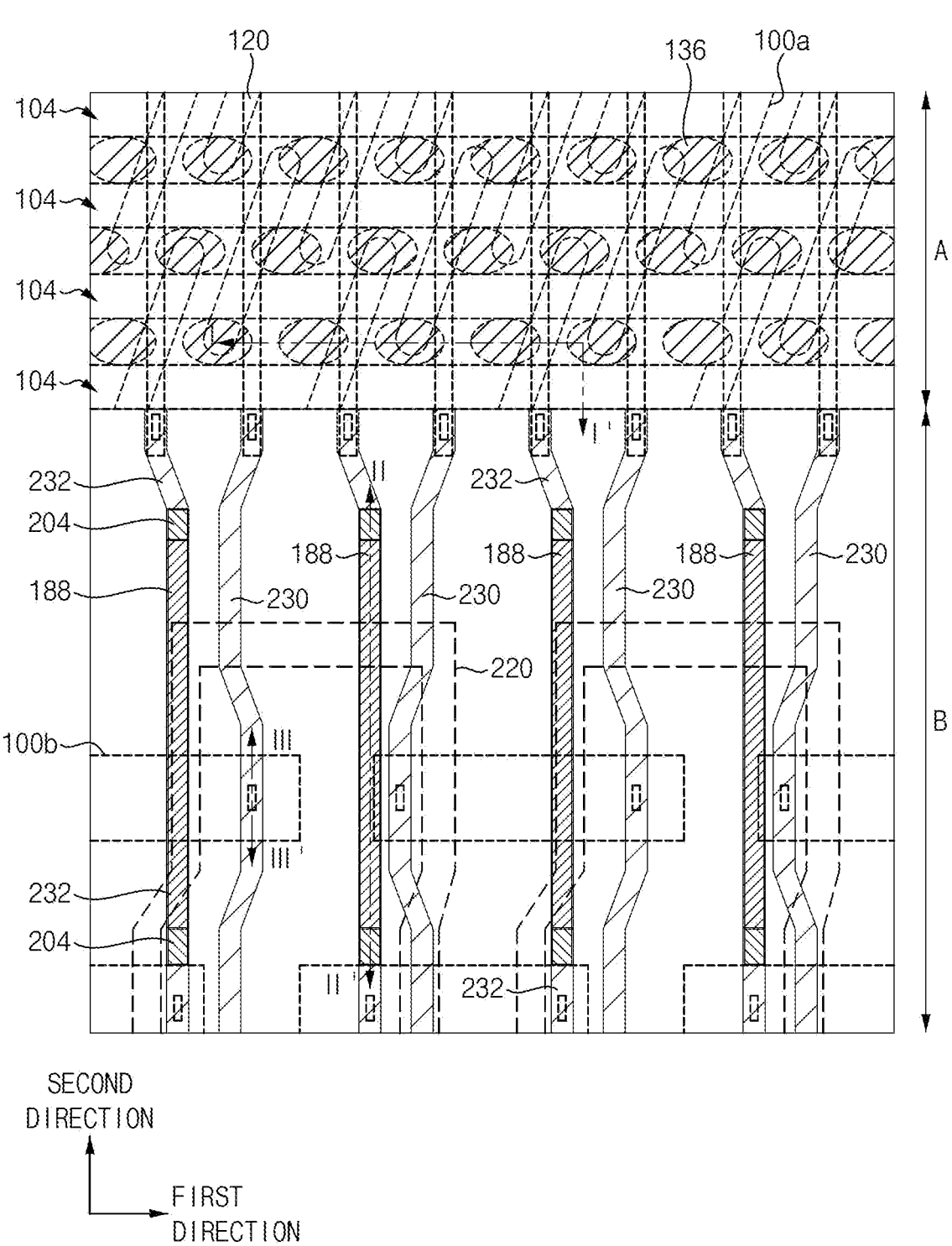
Figure 3:
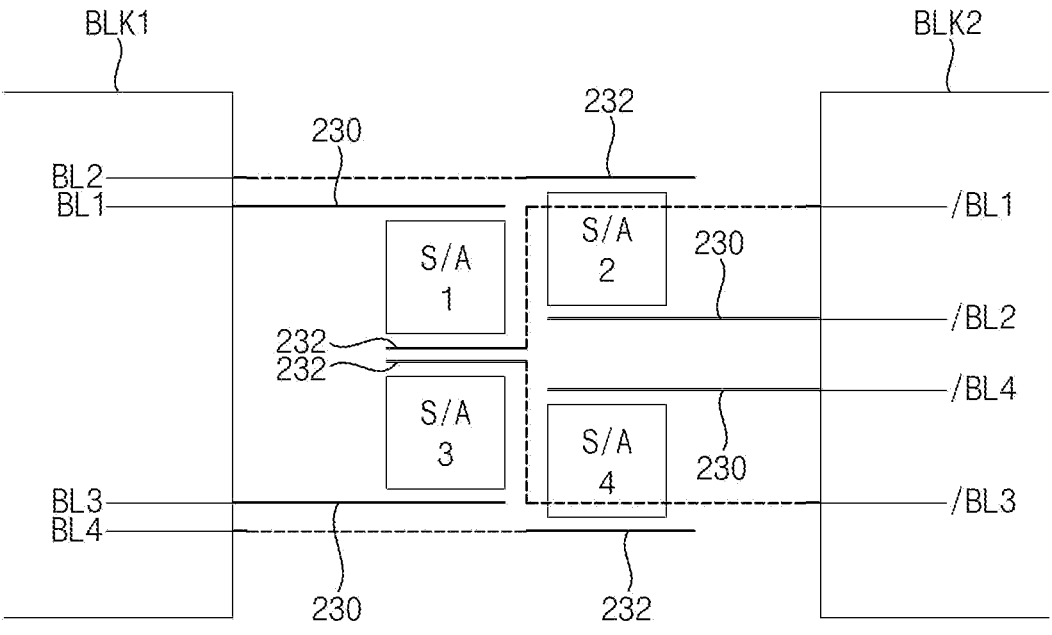

FIG. 1 is a cross-sectional view of a DRAM device according to an embodiment of the present disclosure. FIG. 2 is a plan view illustrating a portion of a DRAM device according to an embodiment of the present disclosure. FIG. 3 is a block diagram illustrating first and second connection lines connected to bit line structures.

Particularly, FIG. 1 includes cross-sectional views taken along lines I-I', II-II, and III-III' of FIG. 2. FIG. 2 is a plan view illustrating bit line wiring in a cell region and a peripheral circuit region adjacent to the cell region. In FIG. 2, some structures (e.g., capacitors, contact plugs, etc.) are omitted to avoid complexity of the drawing and for convenience of explanation.

Referring to FIGS. 1 and 2, a DRAM device may be formed on a substrate 100 including a cell region A and a peripheral circuit region B.

In an embodiment, the substrate 100 may be a wafer including a III-V compound such as silicon, germanium, silicon-germanium, or GaP, GaAs, and GaSb. For example, in some embodiments, the substrate 100 may be a Silicon On Insulator (SOI) wafer or a Germanium On Insulator (GOI) wafer.

A device isolation layer 102 may be formed at an upper portion of the substrate 100. The substrate 100 between the device isolation layers 102 may be defined as an active region. A first active pattern 100a may be formed in the cell region A, and a second active pattern 100b may be formed in the peripheral circuit region B.

The substrate 100 of the cell region A may include a gate trench extending in a first direction parallel to an upper surface of the substrate 100. A first gate structure 104 may be formed in the gate trench.

In an embodiment, the first gate structure 104 may include a gate insulation layer, a gate electrode, and a capping insulation pattern. The first gate structure 104 may extend in the first direction. A plurality of the first gate structures 104 may be arranged in a second direction parallel to the surface of the substrate 100 and perpendicular to the first direction. The plurality of first gate structures 104 may be spaced apart from each other in the second direction.

First and second impurity regions serving as source/drain regions may be formed at an upper portion of the active region between the first gate structures 104. The first gate structure 104 and the first and second impurity regions may serve as a selection transistor. The selection transistor may be a recess channel transistor including a gate buried in the substrate 100.

An insulation pattern 106 may be formed on the first active pattern 100a, the device isolation layer 102, and the first gate structure 104 in the cell region A. In an embodiment, a recess may be formed on a portion of the substrate 100 where the insulation pattern 106 is not formed. An upper surface of the first impurity region may be exposed by a lower surface of the recess.

A bit line structure 120 may be formed on (e.g., formed directly thereon) the insulation pattern 106 and the recess. The bit line structure 120 may be formed on the substrate 100 of the cell region A. The bit line structure 120 may directly contact the first impurity region.

In an embodiment, the bit line structure 120 may include a first conductive pattern 120a, a first barrier metal pattern 120b, a first metal pattern 120c, and a hard mask pattern 120d that are stacked on each other (e.g., in a vertical direction). In an embodiment, the first conductive pattern 120a may include polysilicon doped with impurities. However, embodiments of the present disclosure are not necessarily limited thereto. The bit line structure 120 may extend in the second direction. A plurality of bit line structures may be disposed to be spaced apart from each other in the first direction. In an embodiment, a first spacer 122 may be formed on sidewalls of the bit line structure 120.

A peripheral circuit transistor 224 may be formed on the substrate 100 in the peripheral circuit region B. In an embodiment, the peripheral circuit transistor 224 may include a second gate structure 220 and impurity regions 222 serving as source/drain regions. The impurity regions 222 may be formed at upper portions of the second active pattern 100b adjacent to both sides of the second gate structure 220, respectively. In an embodiment, the peripheral circuit transistor 224 may serve as a sense amplifier, a page buffer, a command circuit, or the like. For example, the peripheral circuit transistor 224 may constitute a bit line sense amplifier.

In an embodiment, the second gate structure 220 may include a second gate insulation pattern 107, the first conductive pattern 120a, the first barrier metal pattern 120b, the first metal pattern 120c and the hard mask pattern 120d stacked on each other (e.g., in the vertical direction). In an embodiment, the second gate structure 220 may be formed on substantially the same plane as the bit line structure 120 in the cell region A. For example, the second gate structure 220 and the bit line structure 120 may be coplanar with each other in the vertical direction. The second gate structure 220 and the bit line structure 120 may have the same stacked structure. For example, in an embodiment, each of the second gate structure 220 and the bit line structure 120 may include the same stacked structure including the first conductive pattern 120a, the first barrier metal pattern 120b, the first metal pattern 120c and the hard mask pattern 120d.

In an embodiment, a second spacer 124 may be formed on sidewalls of the second gate structure 220.

A first insulating interlayer 126 may be formed to fill a space between the bit line structures 120, and may be formed to cover sidewalls of the second gate structure 220 in the peripheral circuit transistor 224. In an embodiment, an upper surface of the first insulating interlayer 126 may be substantially coplanar with an upper surface of the bit line structure 120 and an upper surface of the second gate structure 220 (e.g., in the vertical direction).

A stacked structure including a first lower contact plug 130 and a landing pad 136 may pass through the first insulating interlayer 126 and the insulation pattern 106 in the cell region A, and the stacked structure may directly contact the second impurity region. The stacked structure may form a lower contact structure and may be disposed between the bit line structures 120.

The first lower contact plug 130 may be formed between the bit line structures 120, and may be spaced apart from each other. An upper surface of the first lower contact plug 130 may be lower than an upper surface of the bit line structure 120. In an embodiment, the first lower contact plug 130 may include polysilicon. However, embodiments of the present disclosure are not necessarily limited thereto.

The landing pad 136 may be formed on the first lower contact plug 130 (e.g., formed directly thereon). An upper surface of the landing pad 136 may be higher than the upper surface of the bit line structure 120. A first upper insulation pattern 140 may be formed between the landing pads 136. In an embodiment, a portion of the hard mask pattern 120*d* of the bit line structure 120 directly contacting a bottom surface of the first upper insulation pattern 140 may be partially etched to have a recessed shape. In an embodiment, the landing pad 136 may include tungsten. However, embodiments of the present disclosure are not necessarily limited thereto. In some embodiments, a barrier metal pattern may be further included on an interface between the landing pad 136 and the first lower contact plug 130.

A second lower contact plug 132 may pass through the first insulating interlayer 126 in the peripheral circuit region B, and the second lower contact plug 132 may be electrically connected to impurity regions 222 of the peripheral circuit transistor 224 or the first metal pattern 120*c* of the second gate structure 220.

A first connection line group may be formed on the first insulating interlayer 126 in the peripheral circuit region B. The first connection line group may include wiring lines for electrically connecting the peripheral circuits. In an embodiment, the first connection line group may include a material that is the same as a material of the landing pad 136 in the cell region A. Upper surfaces of the wiring lines included in the first connection line group may be coplanar with an upper surface of the landing pad 136 (e.g., in the vertical direction).

The first connection line group may include first connection lines 230 and second connection lines 232. The first connection line 230 may be connected between target connection points having a relatively short length by one line without a cutting portion disposed between the target connection points. The second connection lines 232 may have two separated lines having a cutting portion between the target connection points, such as at a middle portion between the target connection points, and the second connection lines 232 may be formed to be electrically connected between target connection points having a relatively long length.

In an embodiment, bit line connection lines connected to the bit line structures 120, respectively, may be formed in the peripheral circuit region B adjacent to an end of the bit line structure 120. The first connection line group may include the bit line connection lines.

Hereinafter, the bit line connection lines electrically connected to the bit line structure 120 may be described as connection lines included in the first connection line group. However, the connection lines included in the first connection line group are not necessarily limited thereto. The first connection line group may be equally applied to other connection lines of peripheral circuits.

The first connection lines 230 and the second connection lines 232 may be electrically connected to the bit line structures 120, respectively. The first and second connection lines 230 and 232 may be connected one by one to each of bit line structures 120. Each of the bit line structures 120 may be connected to one of the first and second connection lines 230 and 232. For example, a contact plug may be formed on the end in the second direction of the bit line structure 120, and each of the first and second connection lines 230 and 232 may be electrically connected to the first metal pattern 120*c* of the bit line structure 120 through the contact plug. Each of the first and second connection lines 230 and 232 may be electrically connected to a bit line sense amplifier for distinguishing data stored in cells. The first and second connection lines 230, 232 may be disposed above the peripheral circuit transistor 224, such as the bit line sense amplifier. In each of the first and second connection lines 230 and 232, the target connection points may be one end of the bit line structure 120 in the cell region A and the peripheral circuit transistor 224 serving as the bit line sense amplifier.

The first connection lines 230 may be directly connected the end of the bit line structure and the bit line sense amplifier. The second connection lines 232 may not be directly connected the end of the bit line structure and the bit line sense amplifier. For example, the second connection lines 232 may include a first portion connected to the bit line structure 120 and a second portion connected to the bit line sense amplifier. The first and second portions may be spaced apart from each other. A portion between the bit line structure 120 and the bit line amplifier may not include the second connection lines 232, so that the second connection lines 232 have a cutting (e.g., disconnected) portion and a cutting shape.

For example, as shown in FIG. 3, in an embodiment which includes an open bit line structure, complementary pair bit lines (e.g., a bit line and a bit line bar) may be disposed in different cell blocks, respectively. The complementary pair bit lines may have a schematic structure that is disposed on both sides of the bit line sense amplifier. In this embodiment, the first connection line 230 may be a line to be directly connected to a bit line sense amplifier adjacent to the cell block. The second connection lines 232 may be a line for electrically connecting a bit line sense amplifier disposed relatively far from the cell block, and thus the second connection lines 232 may have the cutting portion between the bit line structure and the bit line amplifier.

Referring to FIG. 3, the first connection line 230 connected to bit line 1 (BL1) in the first cell block BLK1 may be directly connected to the bit line sense amplifiers S/A1 adjacent to the first cell block BLK1. The first connection line 230 connected to bit line 3 (BL3) in the first cell block BLK1 may be directly connected to the bit line sense amplifiers S/A3 adjacent to the first cell block BLK1. The second connection lines 232 connected to bit line bar 1 (/BL1) in the second cell block BLK2 may not be directly connected to the bit line sense amplifiers S/A1 disposed relatively far from the second cell block BLK2. The second connection lines 232 connected to bit line bar 3 (/BL3) in the second cell block BLK2 may not be directly connected to the bit line sense amplifiers S/A3 disposed relatively far from the second cell block BLK2. The cutting portion (e.g., a portion indicated by a dotted line) may be electrically connected to the second connection lines 232 via a third connection line and a second contact plug, which may be described later.

The second connection line 232 connected to the bit line 2 (BL2) in the first cell block BLK1 may not be directly connected to the bit line amplifiers S/A2 disposed relatively far from the first cell block BLK1. The second connection line 232 connected to the bit line 4 (BL4) in the first cell block BLK1 may not be directly connected to the bit line amplifiers S/A4 disposed relatively far from the first cell block BLK1. The cutting portion (e.g., a portion indicated by a dotted line) may be electrically connected to the second connection lines 232 via the third connection line and the second contact plug, which may be described later. The first connection lines 230 connected to bit line bar 2 (/BL2) in the second cell block BLK2 may be directly connected to the bit line sense amplifiers S/A2 adjacent to the second cell block BLK2. The first connection lines 230 connected to bit line bar 4 (/BL4) in the second cell block BLK2 may be directly connected to the bit line sense amplifiers S/A2 adjacent to the second cell block BLK2.

A second upper insulation pattern 142 may be formed between the first and second connection lines 230 and 232 included in the connection line group. Upper surfaces of the first and second connection lines 230 and 232 and the first and second upper insulation patterns 140 and 142 may be coplanar with an upper surface of the landing pad 136 (e.g., in the vertical direction).

An etch stop layer 150 may be formed on (e.g., formed directly thereon) the upper surfaces of the landing pad 136, the first and second connection lines 230 and 232, and the first and second upper insulation patterns 140 and 142. In an embodiment, the etch stop layer 150 may include silicon nitride. However, embodiments of the present disclosure are not necessarily limited thereto.

A cell capacitor may directly contact the landing pad 136, and may pass through the etch stop layer 150. The cell capacitor may include a lower electrode 162, a dielectric layer pattern 170a, and an upper electrode 172a. In an embodiment, the cell capacitor may further include a lower support layer pattern 154a and an upper support layer pattern 158a for supporting the lower electrode 162.

The lower electrode 162 may be formed on the landing pads 136, and may pass through the etch stop layer 150. In an embodiments, the lower electrodes 162 may have a filled cylindrical shape, such as a pillar shape. However, embodiments of the present disclosure are not necessarily limited thereto. For example, in some embodiments the lower electrodes 162 may have a cylindrical shape, such as a cup shape.

In an embodiment, the lower electrode 162 may include a metal, such as Ti, W, Ni, or Co, or a metal nitride, such as TiN, TiSiN, TiAlN, TaN, TaSiN, or WN. For example, the lower electrode 162 may include TiN.

Each of the lower support layer pattern 154a and the upper support layer pattern 158a may be disposed between sidewalls of the lower electrodes 162. Each of the lower support layer pattern 154a and the upper support layer pattern 158a may be directly connected to the sidewalls of the lower electrodes 162, and may support the lower electrodes 162. In an embodiment, the lower support layer pattern 154a and the upper support layer pattern 158a may include an insulation material, such as silicon nitride or silicon oxynitride. However, embodiments of the present disclosure are not necessarily limited thereto.

In some embodiments, at least one of the upper support layer pattern 158a and the lower support layer pattern 154a may not be formed on the sidewalls of the lower electrodes 162. In some embodiments, two or more lower support layer patterns may be formed under the upper support layer pattern 158a.

The dielectric layer pattern 170a may be conformally formed on surfaces of the lower electrode 162, the lower support layer pattern 154a, the upper support layer pattern 158a and the etch stop layer 150. In an embodiment, the dielectric layer pattern 170a may include a high dielectric constant (high-k) layer. In an embodiment, the high-k layer may include a hafnium oxide layer ($HfO_2$), a zirconium oxide layer ($ZrO_2$), an aluminum oxide layer ($Al_2O_3$), or a lanthanum oxide layer ($La_2O_5$). However, embodiments of the present disclosure are not necessarily limited thereto.

An upper electrode 172a may be formed on the dielectric layer pattern 170a. In example embodiments, the upper electrode 172a may include a metal nitride. The metal nitride may include, e.g., titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN) or tungsten nitride (WN).

In some embodiments, the upper electrode 172a may be conformally formed on the dielectric layer pattern 170a, and may not fill a gap between the lower electrodes 162.

The dielectric layer pattern 170a and the upper electrode 172a may be formed only on the substrate 100 of the cell region A. The dielectric layer pattern 170a and the upper electrode 172a may not be formed on the substrate 100 of the peripheral circuit region B. Accordingly, in an edge of the cell region A adjacent to the peripheral circuit region B, the dielectric layer pattern 170a and the upper electrode 172a may be stacked on (e.g., stacked directly thereon) the upper surface of the etch stop layer 150.

A first plate pattern 180a may be formed on (e.g., formed directly thereon) the upper electrode 172a of the cell capacitor. In an embodiment, the first plate pattern 180a may include silicon germanium. In an embodiment, the first plate pattern 180a may cover an uppermost surface of the upper electrode 172a, and may fill a gap between the upper electrodes 172a.

The first plate pattern 180a may be formed only on the substrate 100 of the cell region A. For example, as shown in FIG. 1, the first plate pattern 180a may not be formed on the substrate 100 of the peripheral circuit region B.

Since the lower electrodes 162 are formed only on the substrate 100 of the cell region, a step difference between the cell region A and the peripheral circuit region B may occur due to the lower electrodes 162. In an embodiment, the first plate pattern 180a may include a first portion, a second portion and a third portion according to positions thereof. The first portion may be positioned on (e.g., directly thereon) the upper electrode 172a in the cell region A, and the first portion may have a flat upper surface. The second portion may be positioned at the edge portion of the cell region A adjacent to the peripheral circuit region B, and the second portion may have a vertical upper surface that is perpendicular to the surface of the substrate 100. The third portion may be directly connected to the second portion, and may positioned on (e.g., directly on) the etch stop layer 50 in the cell region A adjacent to the peripheral circuit region B. Thus, the third portion may have a flat upper surface.

A second plate pattern 186 may be formed on only the first portion of the first plate pattern 180a. In an embodiment, the second plate pattern 186 may not be formed on the second and third portions of the first plate pattern 180a. Accordingly, a surface of the second plate pattern 186 may be positioned higher than an upper surface of the lower electrode 162. In an embodiment, an entire lower surface of the second plate pattern 186 may be positioned higher than an uppermost surface of the upper electrode 172a. In an embodiment, the second plate pattern 186 may include metal, such as tungsten. However, embodiments of the present disclosure are not necessarily limited thereto.

In an embodiment, the second plate pattern 186 may include a second barrier metal pattern 185a and a second metal pattern 185b. For example, the second barrier metal pattern 185a may include, titanium, titanium nitride, tantalum, tantalum nitride, or the like. The second metal pattern 185*b* may include tungsten. However, embodiments of the present disclosure are not necessarily limited thereto.

A second insulating interlayer pattern 182 may be formed on the etch stop layer 150 in the peripheral circuit region B. An upper surface of the second insulating interlayer pattern 182 may be substantially coplanar with an upper surface of the first portion of the first plate pattern 180*a*.

A third connection line 188 may be formed on (e.g., formed directly thereon) the second insulating interlayer pattern 182. The third connection line 188 may be opposite (e.g., in the vertical direction) to the cutting portion of first connection line group where the second connection line 232 is not formed. The third connection line 188 may be overlapped with the cutting portion of first connection line group.

In an embodiment, the third connection line 188 may include a metal the same as the metal of the second plate pattern 186. The third connection line 188 may have a stacked structure that is the same as a stacked structure of the second plate pattern 186. The third connection line 188 may be formed on the same plane as the second plate pattern 186 (e.g., in the vertical direction). For example, a bottom surface of the third connection line 188 may be coplanar with a bottom surface of the second plate pattern 186. The third connection line 188 and the second plate pattern 186 may be positioned at the same vertical level. In an embodiment, each of the third connection line 188 and the second plate pattern 186 may include a second barrier metal pattern 185*a* and a second metal pattern 185*b* stacked.

A third insulating interlayer 192 may be formed on (e.g., formed directly thereon) the second plate pattern 186, the third connection line 188 and the second insulating interlayer pattern 182.

A first contact plug 202 may pass through the third insulating interlayer 192 in the cell region A, and may directly contact the second plate pattern 186, such as an upper surface of the second plate pattern 186. The first contact plug 202 may be electrically connected to the upper electrode 172*a* of the capacitor.

A plurality of second contact plugs 204 may pass through the third insulating interlayer 192, the second insulating interlayer pattern 182 and the etch stop layer 150 in the peripheral circuit region B, and may directly contact each of the second connection lines 232. The second contact plugs 204 may extend through in the vertical direction while directly contacting both sidewalls of the third connection line 188, respectively. For example, one second contact plug 204 may directly contact a first lateral sidewall of the third connection line 188 and another second contact plug 204 may directly contact a opposite second lateral sidewall of the third connection line 188. The second contact plugs 204 may electrically connect the second connection lines 232 and the third connection line 188 to each other. Upper surfaces of the second contact plugs 204 may be higher than an upper surface of the third connection line 188.

A third contact plug 206 may pass through the third insulating interlayer 192, the second insulating interlayer pattern 182, and the etch stop layer 150 in the peripheral circuit region B, and may directly contact the first connection line 230, such as an upper surface of the first connection line 230. The third contact plug 206 may serve as a contact plug for electrically connecting the first connection line 230 and upper wirings to each other.

In an embodiment, the first to third contact plugs 202, 204 and 206 may include the same metal. Also, the first to third contact plugs 202, 204, and 206 may have the same stacked structure as each other. For example, in an embodiment the first to third contact plugs 202, 204, and 206 may include tungsten. However, embodiments of the present disclosure are not necessarily limited thereto. In an embodiment, the first to third contact plugs 202, 204 and 206 may include a third barrier metal pattern 200*a* and a third metal pattern 200*b*.

Upper surfaces of the first to third contact plugs 202, 204, and 206 may be coplanar with each other (e.g., in the vertical direction).

As shown in FIGS. 1 and 2, the third connection line 188 may be disposed between the two second contact plugs 204. One of the second contact plugs 204 may directly contact a first sidewall of the third connection lines 188, and the other second contact plug 204 may contact an opposite second sidewall of the third connection line 188. Accordingly, an electrical path along the second connection line 232, one second contact plug 204, the third connection line 188, the other second contact plug 204 and the second connection line 232 may be formed.

As such, even though the second connection lines 232 includes the cutting portion, the portions of the second connection lines 232 on opposite ends of the cutting portion may be electrically connected to each other via the second contact plugs 204 and the third connection line 188. The third connection line 188 may be formed above the second connection lines 232, and may serve as a jumper pattern for electrically connecting the second connection lines 232. Also, at least one of the second contact plugs 204 may serve as a contact plug for electrically connecting the second connection line 232 and the upper wirings.

For example, in an embodiment an end of one of the bit line structures 120 may be connected to the second connection line 232. In this embodiment, the bit line structure 120 may be electrically connected to the bit line sense amplifier through the electrical path along the second connection line 232, one second contact plug 204, the third connection line 188, the other second contact plug 204 and the second connection line 232.

For example, an end of one of the bit line structures 120 may be connected to the first connection line 230. In this embodiment, the bit line structure 120 may be electrically connected to the bit line sense amplifier through the first connection line 230.

In an embodiment, the first connection lines 230 and the second connection lines 232 may extend in the second direction, and may be spaced apart from each other in the first direction. For example, the first connection lines 230 and the second connection lines 232 connected to ends of the bit line structures 120 may be alternately and repeatedly disposed in the first direction.

Since the second connection lines 232 may be spaced apart from each other in the second direction to have the cutting portion, and the second connection line 232 may not be disposed between the first connection lines 230 at the cutting portion. Therefore, an arrangement density of the first connection lines 230 and the second connection lines 232 may be reduced due to the cutting portion. Therefore, a patterning process for forming the first connection lines 230 and the second connection lines 232 may be easily performed, and defects of the first connection lines 230 and the second connection lines 232 may be reduced.

First upper conductive patterns 212 may be formed on the third insulating interlayer 192, and the first upper conductive patterns 212 may directly contact upper surfaces of the first contact plug 202, the second contact plug 204 and the third contact plug 206, respectively. Each of the first upper conductive patterns 212 may directly contact one of upper surfaces of the first contact plug 202, the second contact plug 204 and the third contact plug 206.

In an embodiment, the first upper conductive pattern 212 may not be formed on at least one of the second contact plugs 204. For example, the first upper conductive pattern 212 may not be formed on the upper surface of the second contact plug 204 used only as the jumper wiring among the second contact plugs 204.

A fourth insulating interlayer 210 may be formed on the third insulating interlayer 192 to fill a space between the first upper conductive patterns 212.

As described above, the second connection lines 232 in the peripheral circuit region B in the DRAM device may have the cutting portion, so that the arrangement density of the first connection lines 230 and the second connection lines 232 may be reduced due to the cutting portion. Therefore, the patterning process for forming the first connection lines 230 and the second connection lines 232 may be easily performed, and the defects of the first connection lines 230 and the second connection lines 232 may be reduced.

Also, the second connection lines 232 may be connected to the second contact plug 204 and the third connection line 188 having a jumper structure. In this embodiment, the third connection line 188 may be formed together in the processes for forming the second plate pattern 186 in the cell region. Further, the second contact plug 204 may be formed together in the processes for forming the first contact plug 202 in the cell region. Thus, additional processes for forming the third connection line 188 and the second contact plug 204 may not be required. Accordingly, the DRAM device may be manufactured by relatively simple processes.

FIGS. 4 to 21 are cross-sectional views and plan views illustrating a method of manufacturing a DRAM device according to embodiments of the present disclosure.

FIGS. 4, 6 to 8, 10 to 16, 18, 19 and 21 are cross-sectional views, and FIGS. 5, 9, 17 and 20 are plan views. Each of the cross-sectional views includes cross-sectional views taken along lines II', II-II', and III-III' lines of the plan views.

Figure 4:
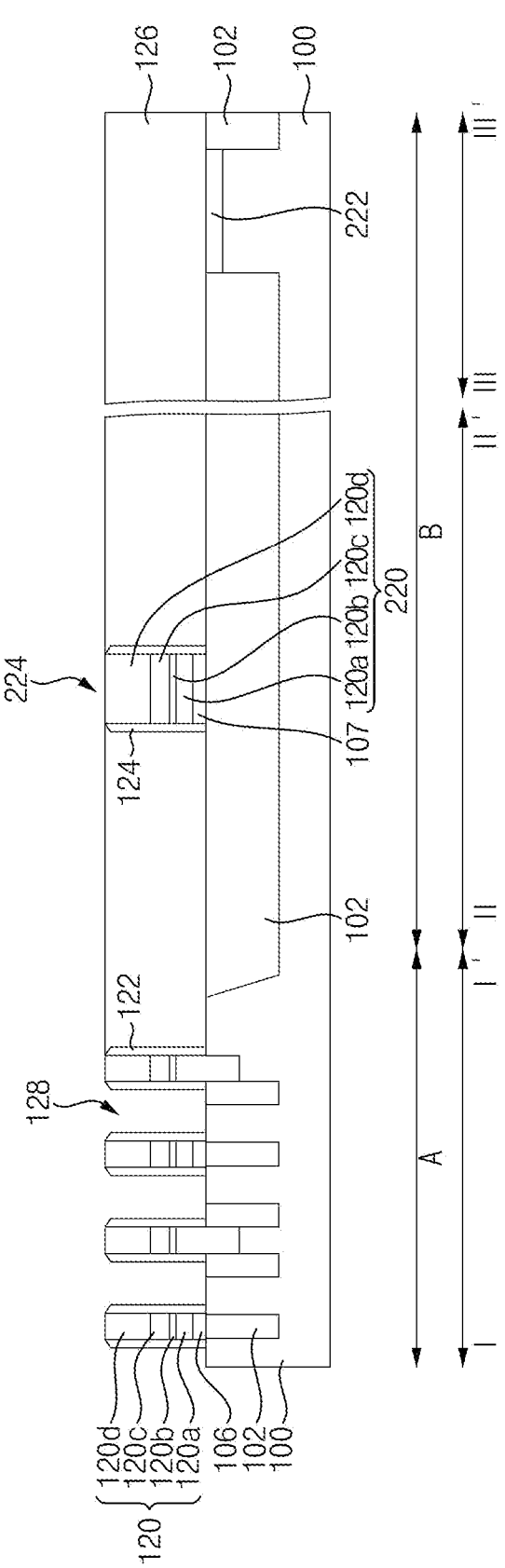
Figure 5:
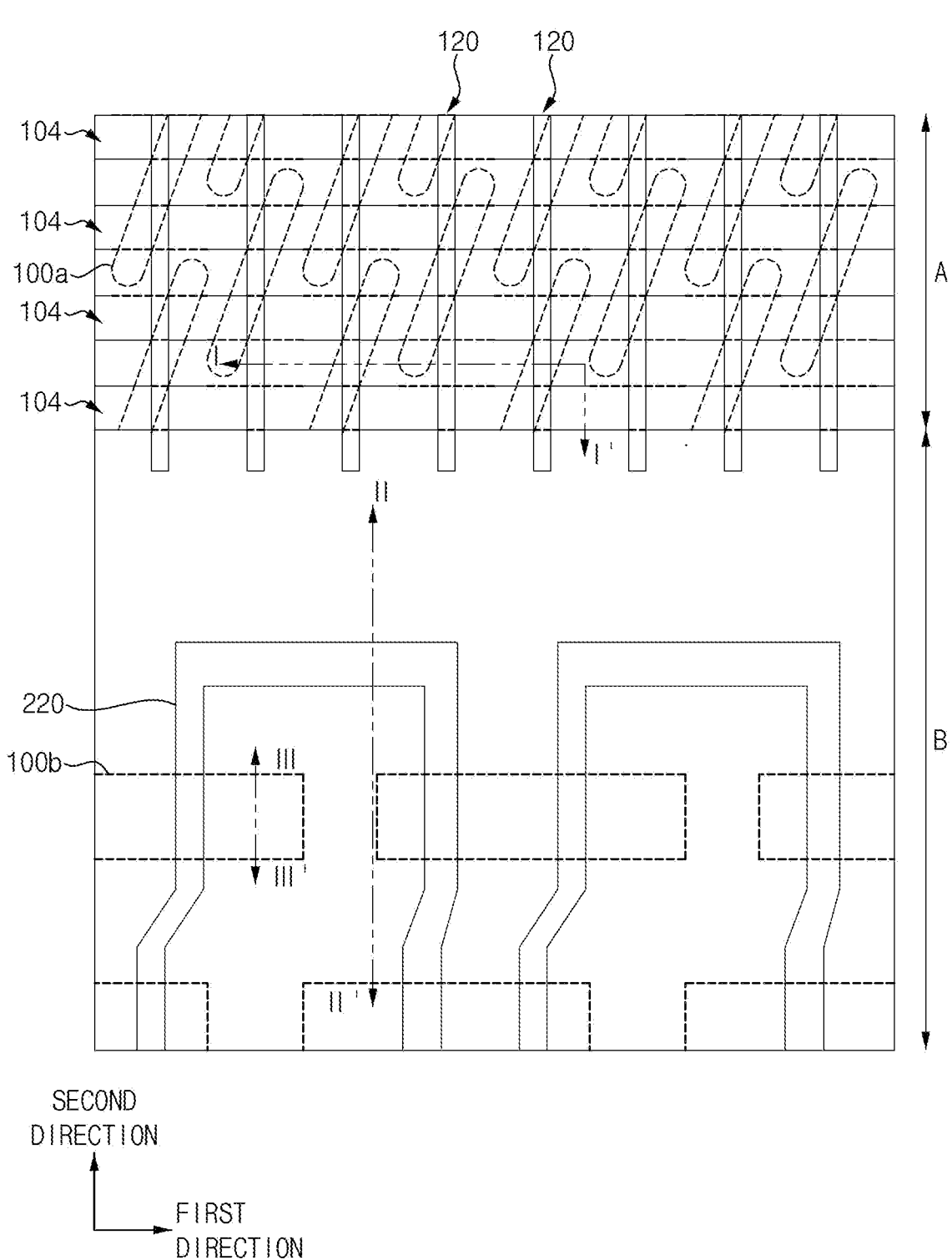

Referring to FIGS. 4 and 5, a device isolation layer 102 may be formed on the substrate 100 including a cell region A and a peripheral circuit region B to define an active region. A first active pattern 100a may be formed in the cell region A, and a second active pattern 100b may be formed in the peripheral circuit region B.

In an embodiment, selection transistors may be formed on the substrate 100 of the cell region A. Each of the selection transistors may include a first gate structure 104 and first and second impurity regions. In an embodiment, a gate trench may be formed by etching a portion of the substrate 100, and the first gate structure 104 may be formed in the gate trench. For example, in an embodiment the first gate structure 104 may include a first gate insulation layer, a gate electrode, and a capping pattern stacked (e.g., in the vertical direction).

An insulation pattern 106 may be formed on the substrate 100 of the cell region A. For example, a recess may be formed at a portion of the substrate 100 between the insulation patterns 106. An upper surface of the first impurity region may be exposed by a bottom surface of the recess. In addition, a second gate insulation layer may be formed on the substrate 100 of the peripheral circuit region B.

Bit line structures 120 may be formed on (e.g., formed directly thereon) the insulation pattern 106 and the recess. In an embodiment, the bit line structure 120 may include a first conductive pattern 120a, a first barrier metal pattern 120b, a first metal pattern 120c and a hard mask pattern 120d stacked (e.g., in the vertical direction). In an embodiment, a first spacer 122 may be formed on sidewalls of the bit line structure 120.

In an embodiment, during the processes for forming the bit line structure 120 in the cell region A, a second gate structure 220 may be also formed on the substrate 100 of the peripheral circuit region B. For example, in an embodiment the second gate structure 220 may include a second gate insulation pattern 107, the first conductive pattern 120a, the first barrier metal pattern 120b, the first metal pattern 120c and a hard mask pattern 120d stacked (e.g., in the vertical direction). In an embodiment, a second spacer 124 may be formed on sidewalls of the second gate structure 220. In an embodiment, after forming the second gate structure 220, impurity regions 222 serving as source and drain regions may be formed at the second active pattern 100b adjacent to both sides of the second gate structure 220, such as by performing an ion implantation process.

Accordingly, a peripheral circuit transistor 224 including the second gate structure 220 and the impurity regions 222 may be formed on the substrate 100 of the peripheral circuit region B. The peripheral circuit transistor 224 may constitute a peripheral circuit. For example, in an embodiment the peripheral circuit transistor 224 may constitute a bit line sense amplifier.

A first insulating interlayer 126 may be formed on the substrate 100 to cover the bit line structures 120 and the peripheral circuit transistor 224. In an embodiment, an upper surface of the first insulating interlayer 126 may be planarized, such as by a chemical mechanical polishing (CMP) process. In an embodiment, the first insulating interlayer 126 may be planarized until upper surfaces of the bit line structure 120 and the second gate structure 220 may be exposed.

In an embodiment, the first insulating interlayer 126 between the bit line structures 120 may be etched to form a lower contact hole 128 exposing the second impurity region of the substrate 100.

Figure 6:
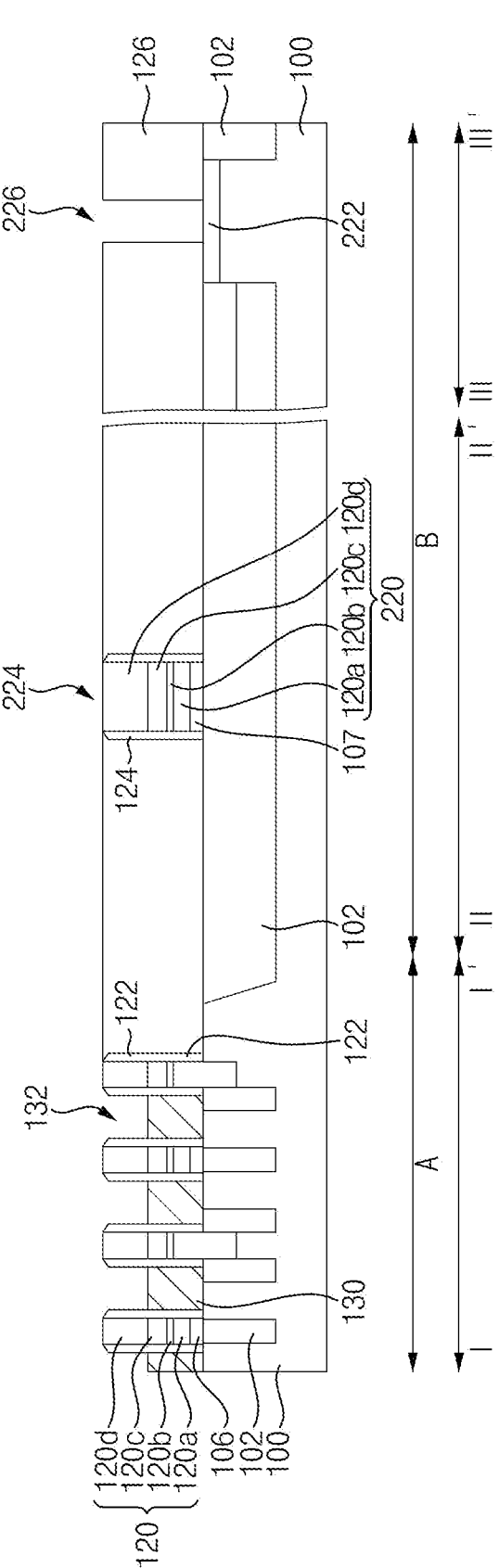

Referring to FIG. 6, a first conductive layer may be formed on (e.g., formed directly thereon) the first insulating interlayer 126 and the exposed second impurity region of the substrate 100 to fill the lower contact hole 128. In an embodiment, the first conductive layer may then be partially etched by an etch-back process to form a first lower contact plug 130 filling the lower portion of the lower contact hole 128. In the etch-back process, the first conductive layer formed on the first insulating interlayer 126 may be completely removed. In an embodiment, the first lower contact plug 130 may include polysilicon. However, embodiments of the present disclosure are not necessarily limited thereto.

Thereafter, the first insulating interlayer 126 in the peripheral circuit region B may be etched to form a first contact hole 226 exposing at least a portion of the impurity region 222 at the second active pattern 100b.

Additionally, in an embodiment an opening may be formed to expose the first metal pattern 120c of the bit line structure 120. The opening may be formed at an end portion in the second direction of the bit line structure 120.

Figure 7:
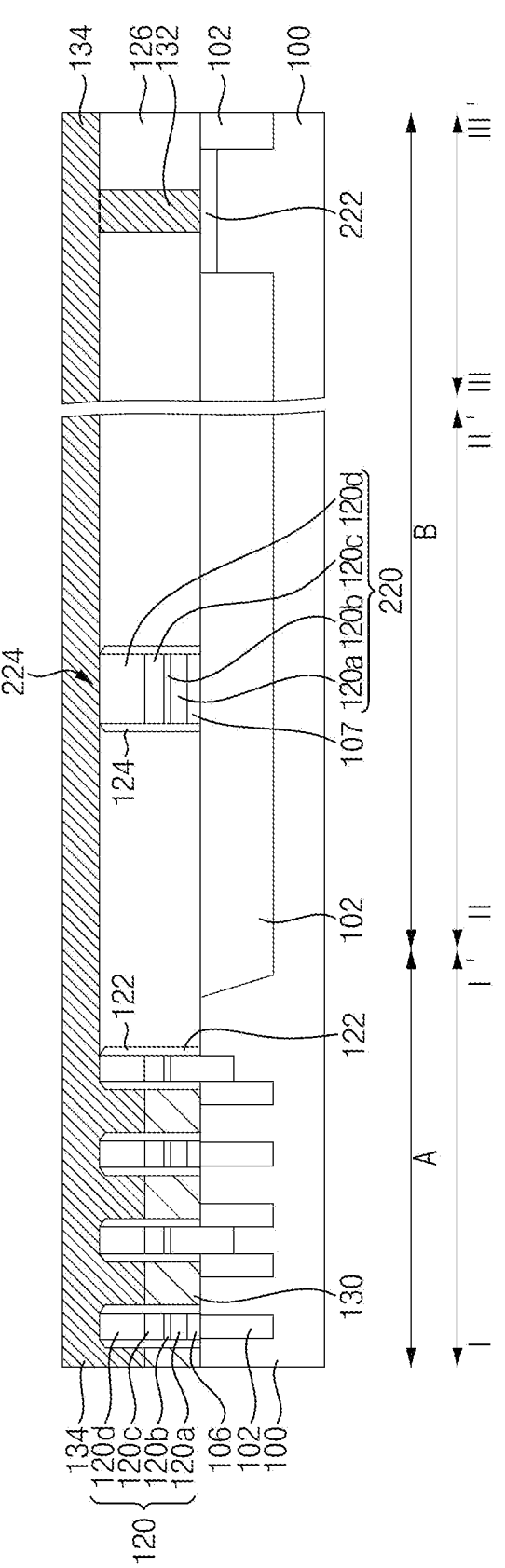

Referring to FIG. 7, a second conductive layer 134 may be formed to cover the bit line structure 120, the first lower contact plug 130, the first insulating interlayer 126 and the second gate structure 220 while filling the lower contact hole 128 and the first contact hole 226. In an embodiment, the second conductive layer 134 may include a metal, such as tungsten. In some embodiments, a barrier metal layer may be further formed, before forming the second conductive layer 134.

In an embodiment, a metal silicide pattern may be further formed on the first lower contact plug 130, before forming the second conductive layer 134 thereon. In this embodiment, the metal silicide pattern may also be formed on the surface of the substrate 100 exposed by the bottom surface of the first contact hole 226 in the peripheral circuit region B, such as an upper portion of the impurity region 222. By the above process, a second lower contact plug 132 may be formed in the first contact hole 226 in the peripheral circuit region B.

Figure 8:
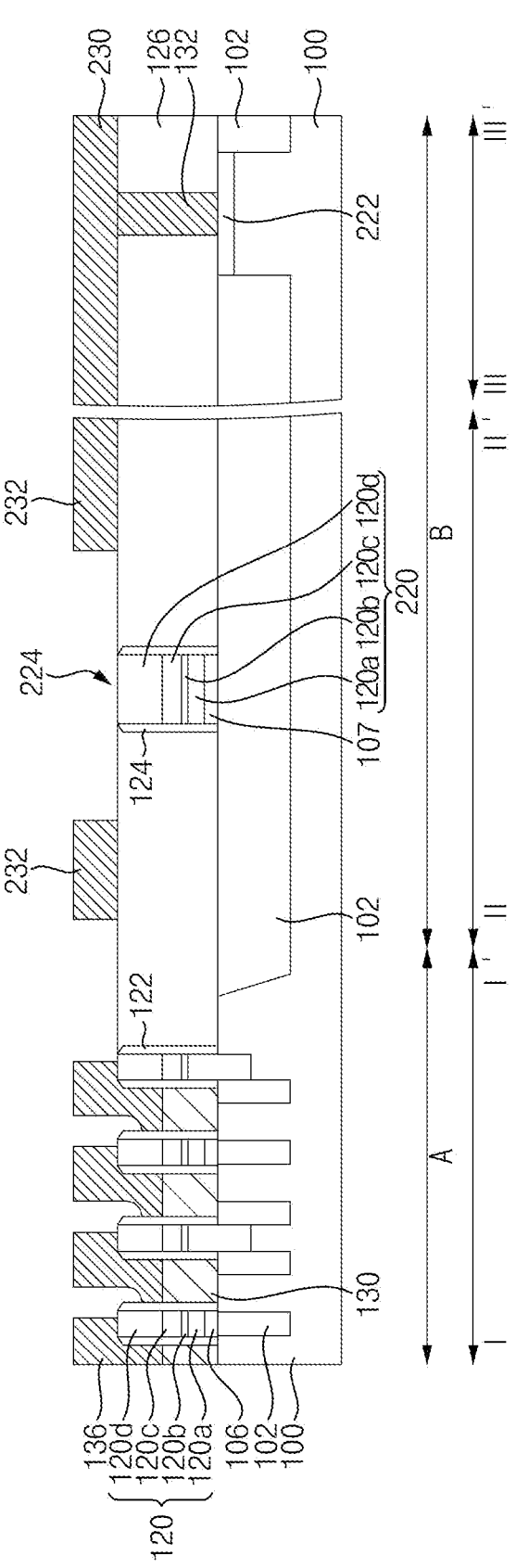
Figure 9:
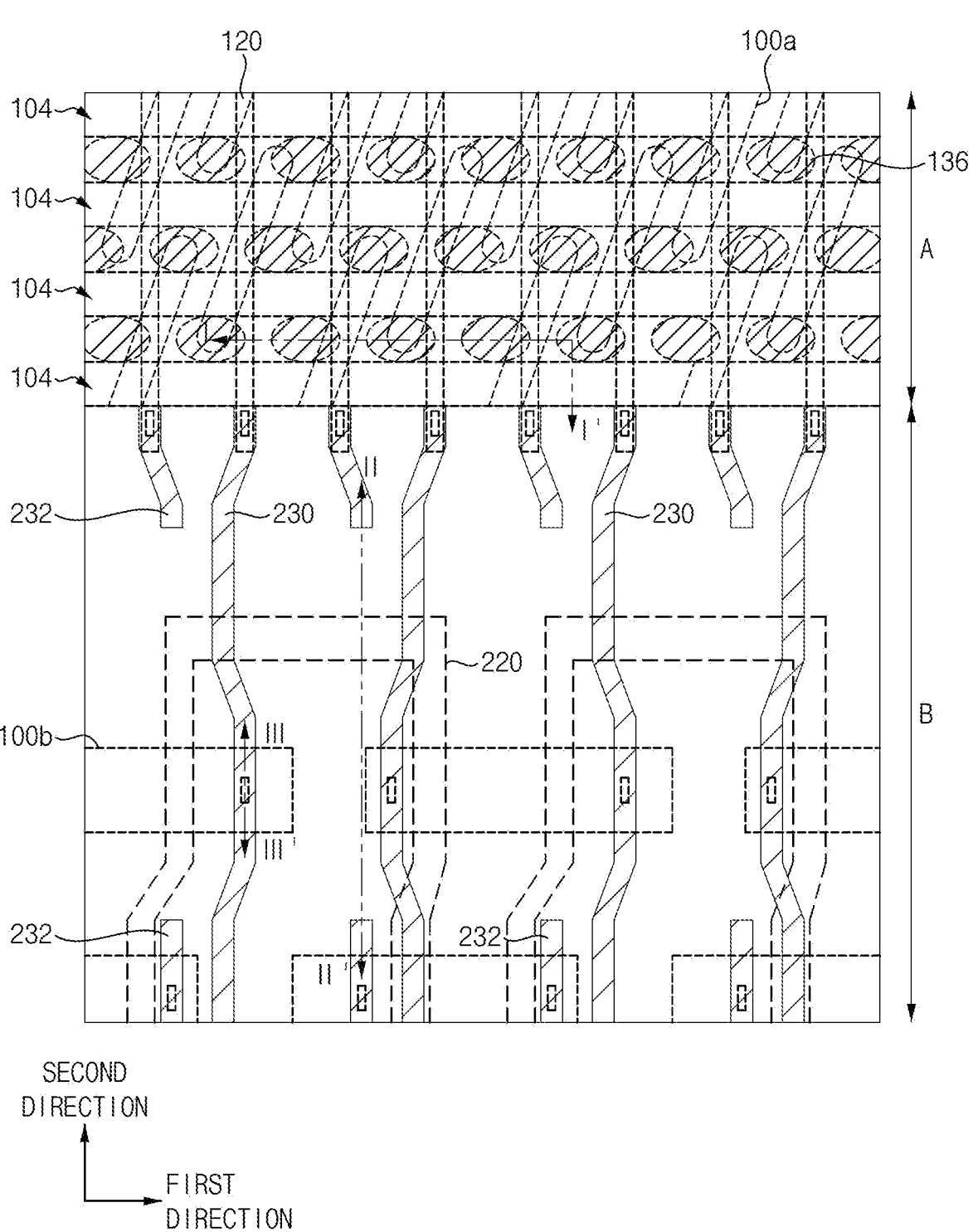

Referring to FIGS. 8 and 9, the second conductive layer 134 in the cell region A may be patterned to form a landing pad 136 directly contacting an upper surface of the first lower contact plug 130. The second conductive layer 134 in the peripheral circuit region B may be patterned to form first connection lines 230 and second connection lines 232. The first and second connection lines 230 and 232 may be collectively referred to as a first connection line group. In an embodiment, the patterning process for forming the landing pad 136 and the first and second connection lines 230 and 232 in the cell region A and the peripheral circuit region B may be performed as different patterning processes, respectively. Alternatively, the patterning process for forming the landing pad 136 and the first and second connection lines 230 and 232 in the cell region A and the peripheral circuit region B may be performed as one patterning process.

In the patterning process, the hard mask pattern 120d included in the bit line structure 120 may be partially etched, and thus the upper portion of the bit line structure 120 may have a recessed shape.

The first connection lines 230 may be connected lines without a cutting portion between target connection points. The second connection lines 232 may be lines having the cutting portion between the target connection points.

In an embodiment, each of the first and second connection lines 230 and 232 may be a wiring line electrically connected to the bit line structure 120. For example, each of the first and second connection lines 230 and 232 may be connected one by one to each of bit line structures 120 in the cell region A. For example, the first connection line 230 and the second connection line 232 may be alternately disposed (e.g., in the first direction) in the peripheral circuit region B.

The first connection lines 230 may be lines directly connected from the bit line structure 120 to a bit line sense amplifier for distinguishing data of each of cells. The second connection lines 232 may be lines that may not be directly connected from the bit line structure 120 to the bit line sense amplifier. In an embodiment, the second connection lines 232 may include a first line portion directly connected to the bit line structure 120 and a second line portion connected to the bit line sense amplifier and spaced apart from the first line portion. A portion between the bit line structure 120 and the bit line amplifier may include a cutting portion in which the second connection line 232 is not formed.

In an embodiment, a patterning process for forming the first and second connection lines 230 and 232 may include an EUV lithography process using extreme ultraviolet (EUV) laser equipment.

Since the second connection lines 232 include the cutting portion, an arrangement density of the first and second connection lines 230 and 232 may be reduced. Accordingly, the patterning process of the first and second connection lines 230 and 232 may be easily performed, and defects of the first and second connection lines 230 and 232 may be reduced.

Figure 10:
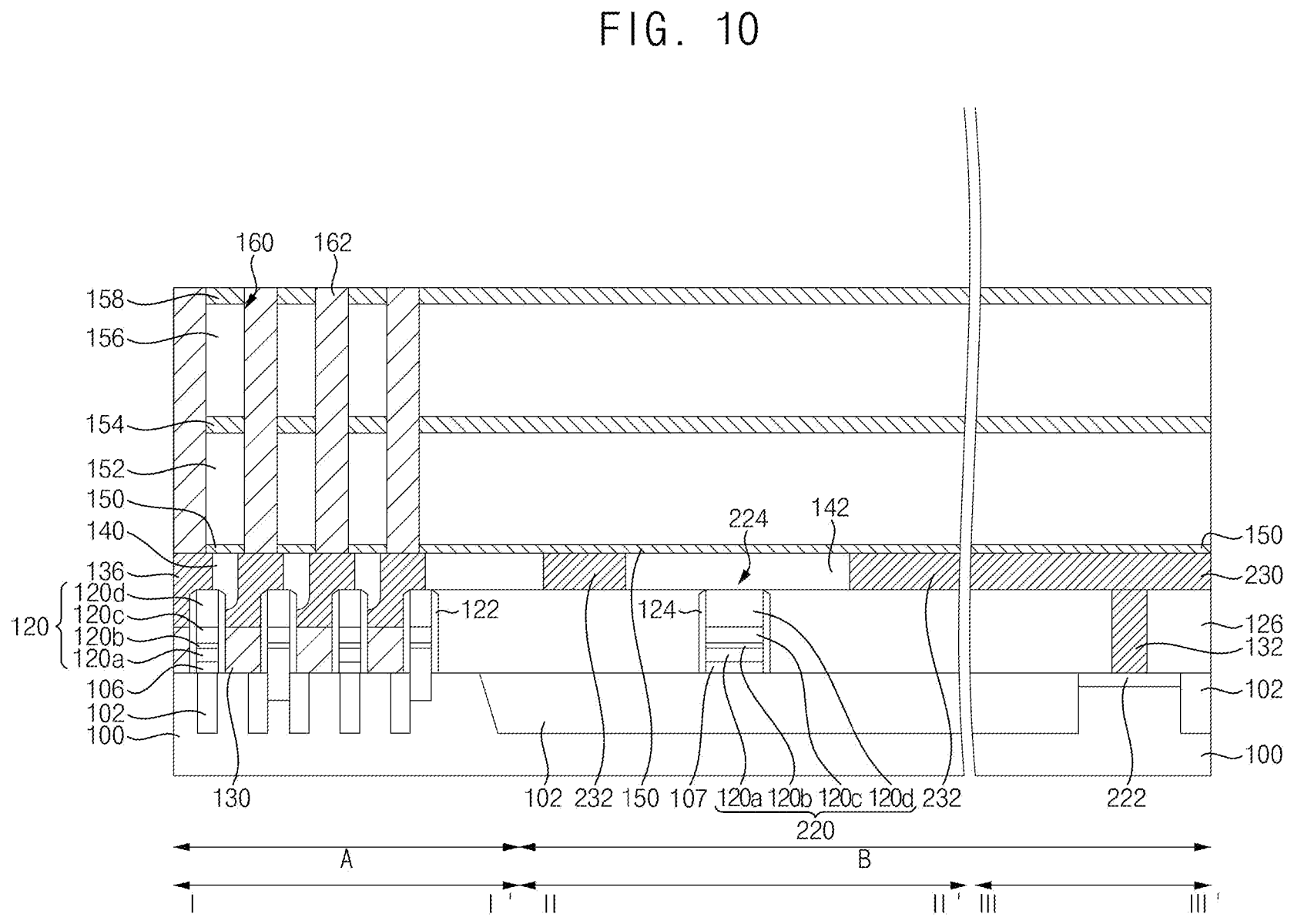

Referring to FIG. 10, an upper insulation layer may be formed on (e.g., formed directly thereon) the landing pad 136, the first and second connection lines 230 and 232 and the first insulating interlayer 126. The upper insulation layer may be planarized until upper surfaces of the landing pad 136 and the first and second connection lines 230 and 232 may be exposed to form a first upper insulation pattern 140 and a second upper insulation pattern 142. In an embodiment, the planarization process may include a chemical mechanical polishing process. However, embodiments of the present disclosure are not necessarily limited thereto.

The first upper insulation pattern 140 may be formed in a gap between the landing pads 136, and the second upper insulation pattern 142 may be formed in a gap between the first and second connection lines 230 and 232. The upper surfaces of the landing pad 136, the first and second connection lines 230 and 232 and the first and second upper insulation patterns 140 and 142 may be substantially coplanar with each other (e.g., in the vertical direction). Also, the upper surfaces of the landing pad 136, the first and second connection lines 230 and 232 and the first and second upper insulation patterns 140 and 142 may be substantially flat.

An etch stop layer 150 may be formed on (e.g., formed directly thereon) the landing pad 136, the first and second connection lines 230 and 232, and the first and second upper insulation patterns 140 and 142. In an embodiment, the etch stop layer 150 may include silicon nitride or silicon oxynitride. However, embodiments of the present disclosure are not necessarily limited thereto.

A first mold layer 152, a lower support layer 154, a second mold layer 156 and an upper support layer 158 may be sequentially deposited on (e.g., directly thereon) the etch stop layer 150 (e.g., in the vertical direction).

In an embodiment, the first and second mold layers 152 and 156 may include a material having an etch selectivity with respect to each of the lower support layer 154 and the upper support layer 158. For example, in an embodiment the first mold layer 152 and the second mold layer 156 may include silicon oxide, and the lower support layer 154 and the upper support layer 158 may include silicon nitride. However, embodiments of the present disclosure are not necessarily limited thereto.

In an embodiment shown in FIG. 10, two support layers comprising the lower support layer 154 and the upper support layer 158 may be included in the semiconductor device. However, embodiments of the present disclosure are not necessarily limited thereto and the semiconductor device may include a single support layer or three or more support layers depending on a structure of a capacitor. In some embodiments, the support layer may not be formed, and one mold layer may be formed on (e.g., formed directly thereon) the etch stop layer 150.

In an embodiment, an etching mask may be formed on the upper support layer 158. The upper support layer 158, the second mold layer 156, the lower support layer 154, the first mold layer 152 and the etch stop layer 150 may be etched using the etching mask to form first holes 160. For example, the etching process may include an anisotropic etching process. The first holes 160 may expose upper surfaces of the landing pads 136 formed in the substrate 100 of the cell region A, respectively.

Thereafter, a lower electrode layer may be formed to fill the first holes 160. The lower electrode layer may be planarized until an upper surface of the upper support layer 158 may be exposed to form a lower electrode 162 filling the first holes 160. In this embodiment, the lower electrodes 162 may have a pillar shape. In an embodiment, the lower electrode 162 may include a metal, such as Ti, W, Ni, or Co or a metal nitride, e.g., TiN, TiSiN, TiAlN, TaN, TaSiN, or WN.

Figure 11:
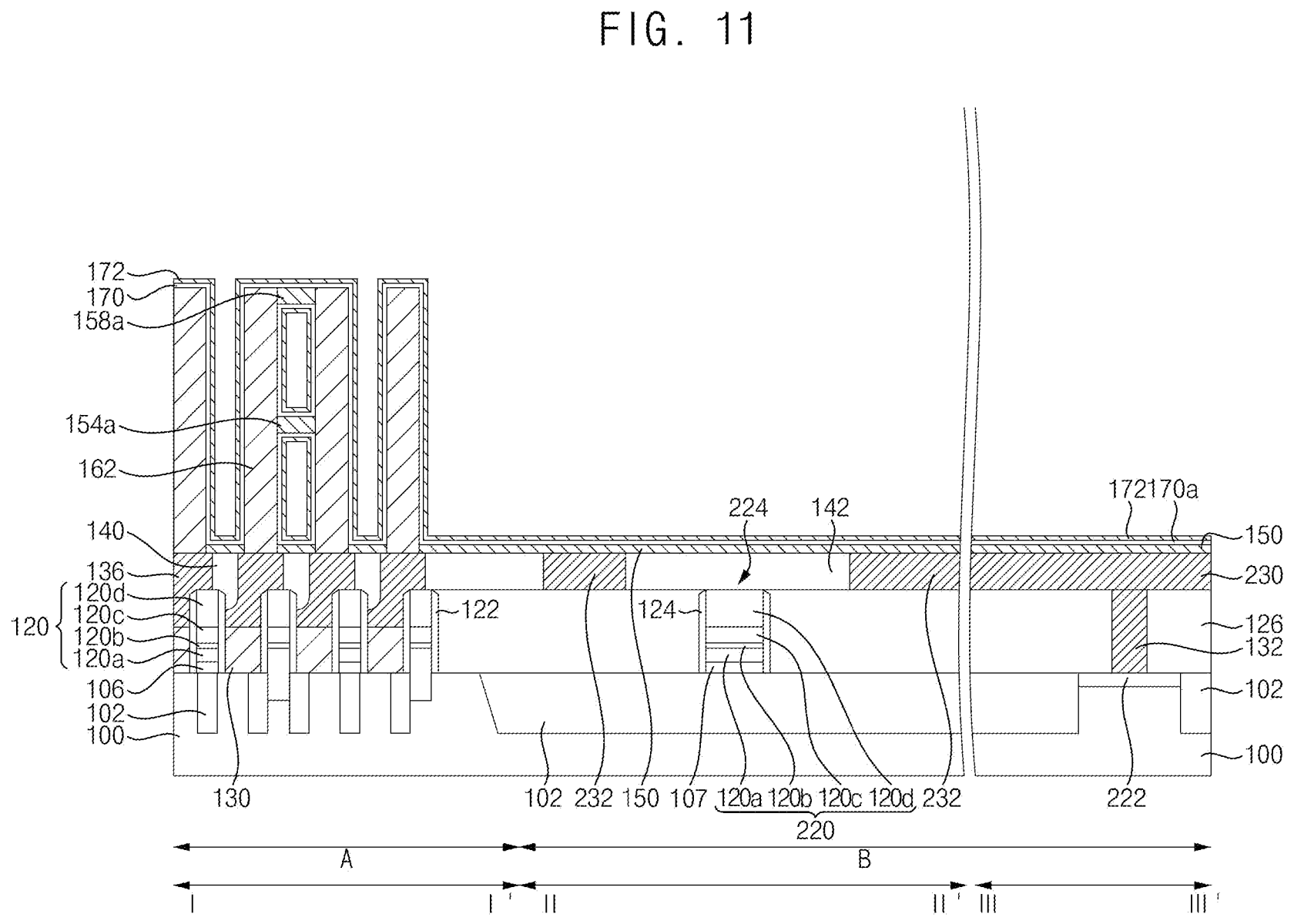

Referring to FIG. 11, a first mask pattern may be formed on the upper support layer 158 and the lower electrode 162. In an embodiment, the first mask pattern may include amorphous carbon or polysilicon. The first mask pattern may include holes.

The upper support layer 158 may be anisotropically etched using the first mask pattern to form second holes exposing an upper portion of the second mold layer 156. Accordingly, an upper support layer pattern 158a may be formed on the substrate 100 of the cell region A. Thereafter, the second mold layer 156 may be wet-etched by etchant supplied through the second holes. Thus, the lower support layer 154 may be exposed, and upper sidewalls of the lower electrodes 162 may be also exposed.

The lower support layer 154 may be etched to form third holes exposing an upper portion of the first mold layer 152. Thus, a lower support layer pattern 154a may be formed on (e.g., formed directly thereon) the sidewall of the lower electrode 162. For example, the first mold layer 152 may be wet-etched by etchant supplied through the third holes.

The upper support layer pattern 158a may be connected to the outer walls of the lower electrodes 162, and may directly contact the outer walls of the lower electrodes 162. The lower support layer pattern 154a may connect to the outer walls of the lower electrodes 162, and may directly contact the outer walls of the lower electrodes 162. Accordingly, the sidewall of the lower electrode 162 may be supported by each of the upper support layer pattern 158a and the lower support layer pattern 154a. Thus, a leaning of the lower electrode 162 may be decreased by the lower and upper support layer patterns 154a, 158a. A surface of the lower electrode 162 may be exposed.

Thereafter, a dielectric layer 170 may be conformally formed on surfaces of the lower electrode 162, the lower and upper support layer patterns 154a and 158a and the etch stop layer 150. An upper electrode layer 172 including metal may be formed on the dielectric layer 170.

The dielectric layer 170 may include a high dielectric constant (high-k) layer. In an embodiment, the high-k layer may include a hafnium oxide layer (HfO$_2$), a zirconium oxide layer (ZrO$_2$), an aluminum oxide layer (Al$_2$O$_3$), or a lanthanum oxide layer (La$_2$O$_5$). However, embodiments of the present disclosure are not necessarily limited thereto.

In an embodiment, the upper electrode layer 172 may be formed of a metal nitride. However, embodiments of the present disclosure are not necessarily limited thereto.

Figure 12:
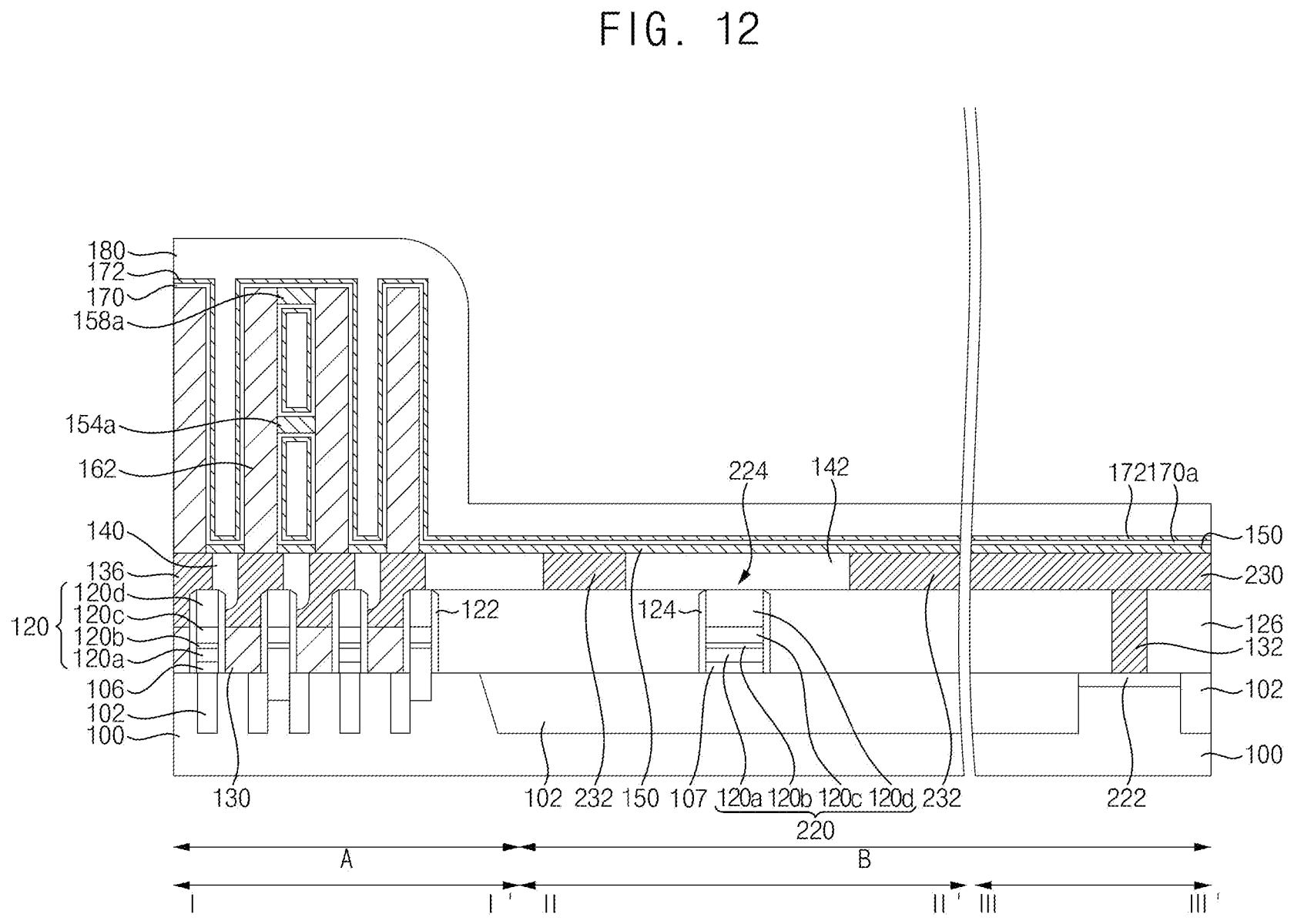

Referring to FIG. 12, a first plate layer 180 may be formed on the upper electrode layer 172. In an embodiment, the first plate layer 180 may include a silicon germanium layer. For example, the silicon germanium layer may be doped with P-type or N-type impurities.

In an embodiment, the silicon germanium layer 234 may be formed by an ALD process or a CVD process using a silicon source gas, a germanium source gas and a dopant gas.

In an embodiment, the silicon source gas may include, e.g., silane (SiH4) or dichlorosilane (SiH2Cl2). The germanium source gas may include, e.g., germane (GeH4) or germanium tetrachloride (GeCl4). The dopant gas may include, e.g., borane (BH3), boron chloride (BCl3), phosphine (PH3), phosphorus chloride (PCl3), or the like. Thereafter, a heat treatment process may be performed to crystallize the first plate layer 180.

The upper electrode layer 172 may include the metal, so that a deposition of the upper electrode layer 172 having a relatively large thickness may not be easy performed. Therefore, if the upper electrode is formed using only the upper electrode layer 172, an exposure of the lower electrode 162 may occur in a subsequent etching process for forming the first contact plug. Therefore, the first plate layer 180 may also serve as a buffer layer to decrease defects in the subsequent etching process.

Figure 13:
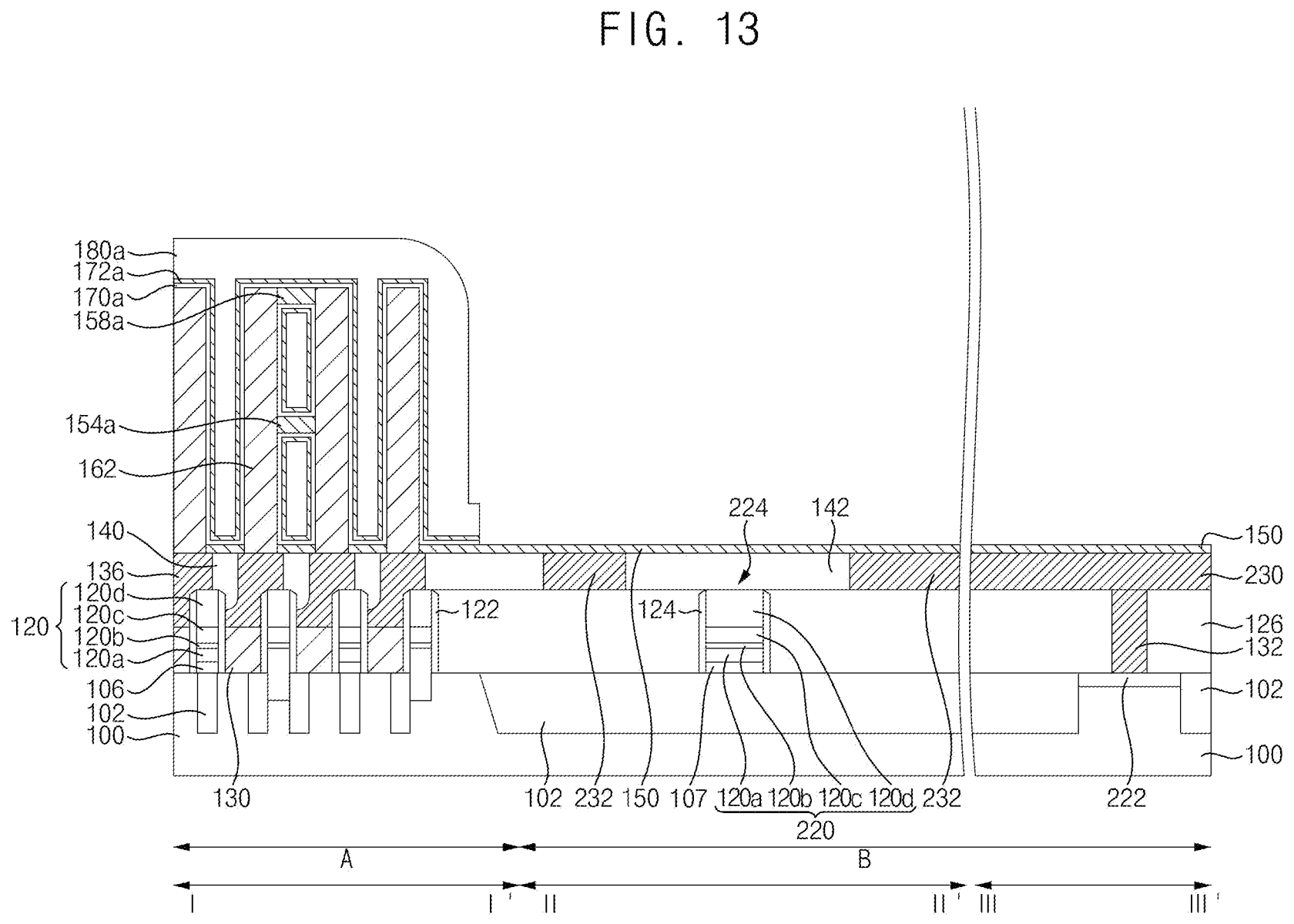

Referring to FIG. 13, in an embodiment a second mask pattern may be formed to cover the first plate layer 180 in the cell region A. The second mask pattern may cover a region from a portion of the first plate layer 180 having an upper surface that is higher than the upper surface of the lower electrode 162 to a portion of the first plate layer 180 formed on the etch stop layer 150 at the edge portion of the cell region A adjacent to the peripheral circuit region B.

The first plate layer 180, the upper electrode layer 172 and the dielectric layer 170 in the peripheral circuit region B may be etched using the second mask pattern as an etch mask to form a dielectric layer pattern 170a, an upper electrode 172a, and a first plate pattern 180a in the cell region A. In addition, an upper surface of the etch stop layer 150 may be exposed in the peripheral circuit region B. After that, the second mask pattern may be removed.

The lower electrodes 162 may be formed only in the cell region A, so that structures formed on the cell region A and the peripheral circuit region B may have a step difference due to the lower electrodes 162. For example, a relatively large difference between a height (e.g., a vertical level) of the upper surface of the first plate pattern 180a in the cell region A and a height of the upper surface of the etch stop layer 150 in the peripheral circuit region B may occur.

Figure 14:
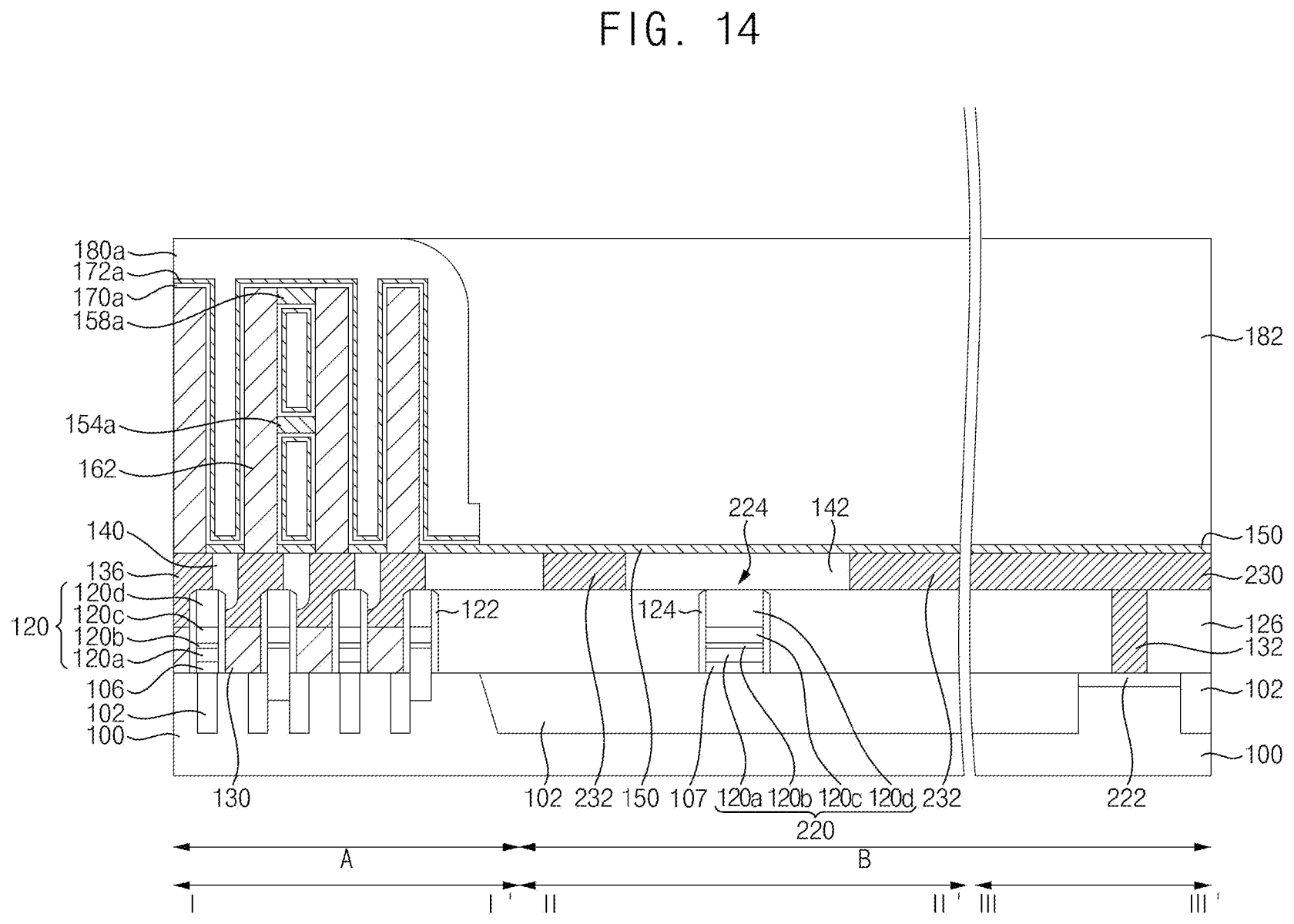

Referring to FIG. 14, in an embodiment a third insulating interlayer may be deposited on (e.g., directly thereon) the first plate pattern 180a and the etch stop layer 150. In an embodiment, the third insulating interlayer may include silicon oxide. In an embodiment, a height of an upper surface of the third insulating interlayer formed in the peripheral circuit region B may be higher than a height of the upper surface of the first plate pattern 180a in the cell region A.

An upper surface of the third insulating interlayer may be planarized until an upper surface of the first plate pattern 180a may be exposed. In an embodiment, the planarization process may include a CMP (chemical mechanical polishing) process. However, embodiments of the present disclosure are not necessarily limited thereto.

Accordingly, an entirety of the third insulating interlayer on the first plate pattern 180a in the cell region A may be removed, and thus the second insulating interlayer pattern 182 may be formed only on the etch stop layer 150 in the peripheral circuit region B.

In an embodiment in which the above process is performed, a first portion of the first plate pattern 180a positioned on the upper electrode 172a in the cell region A and having a flat upper surface may be selectively exposed. In addition, upper surfaces of the first portion of the first plate pattern 180a and the second insulating interlayer pattern 182 may be substantially coplanar with each other (e.g., in the vertical direction). The upper surfaces of first portion of the first plate pattern 180a and the second insulating interlayer pattern 182 may be substantially flat.

Figure 15:
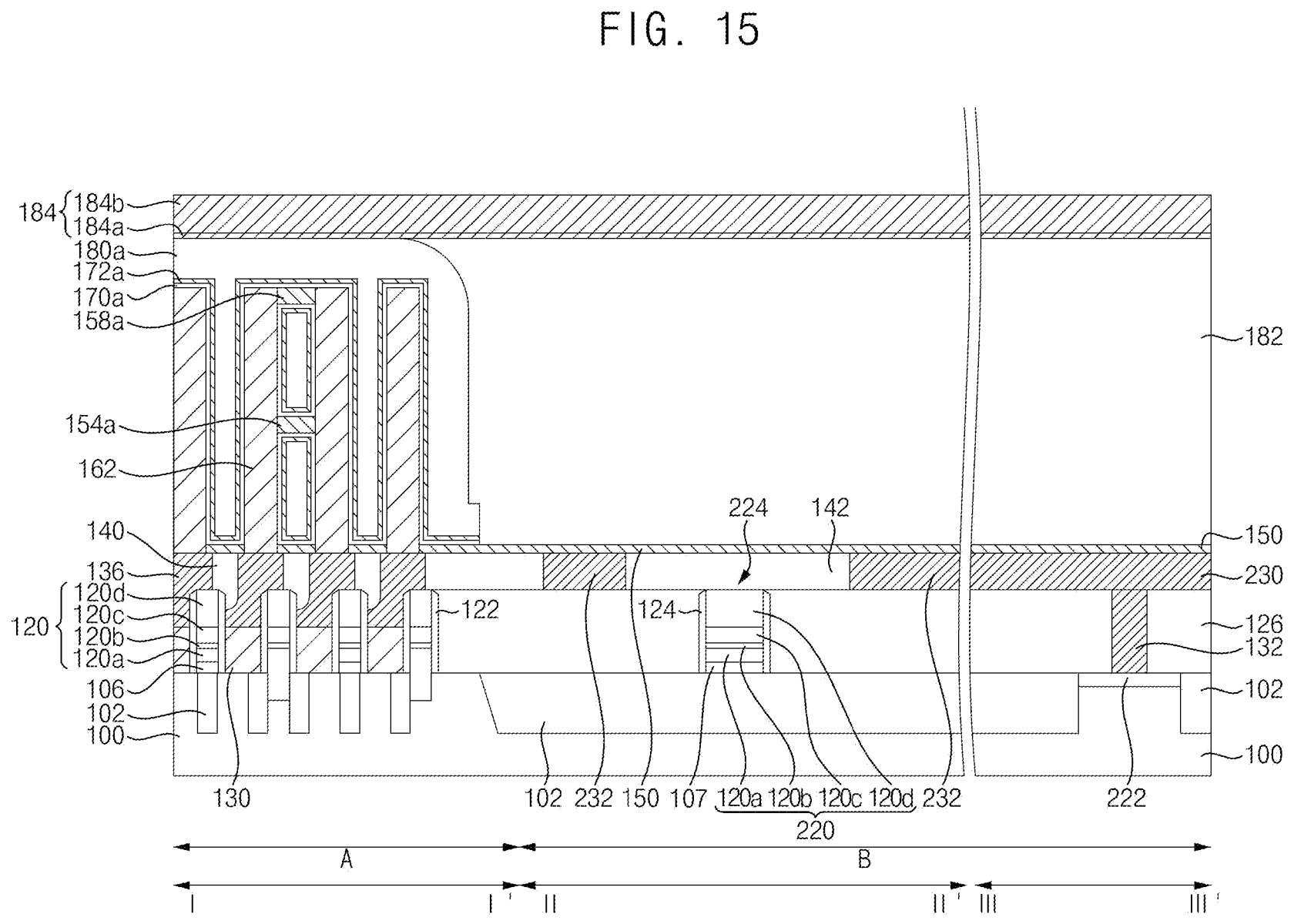

Referring to FIG. 15, a third conductive layer 184 may be formed on (e.g., formed directly thereon) the first portion of the first plate pattern 180a and the second insulating interlayer pattern 182. The third conductive layer 184 may include a metal having a resistance lower than a resistance of the first plate pattern 180a. For example, in an embodiment the third conductive layer 184 may include tungsten. However, embodiments of the present disclosure are not necessarily limited thereto. In an embodiment, the third conductive layer 184 may be formed by stacking a second barrier metal layer 184*a* and a second metal layer 184*b* (e.g., in the vertical direction).

Figure 16:
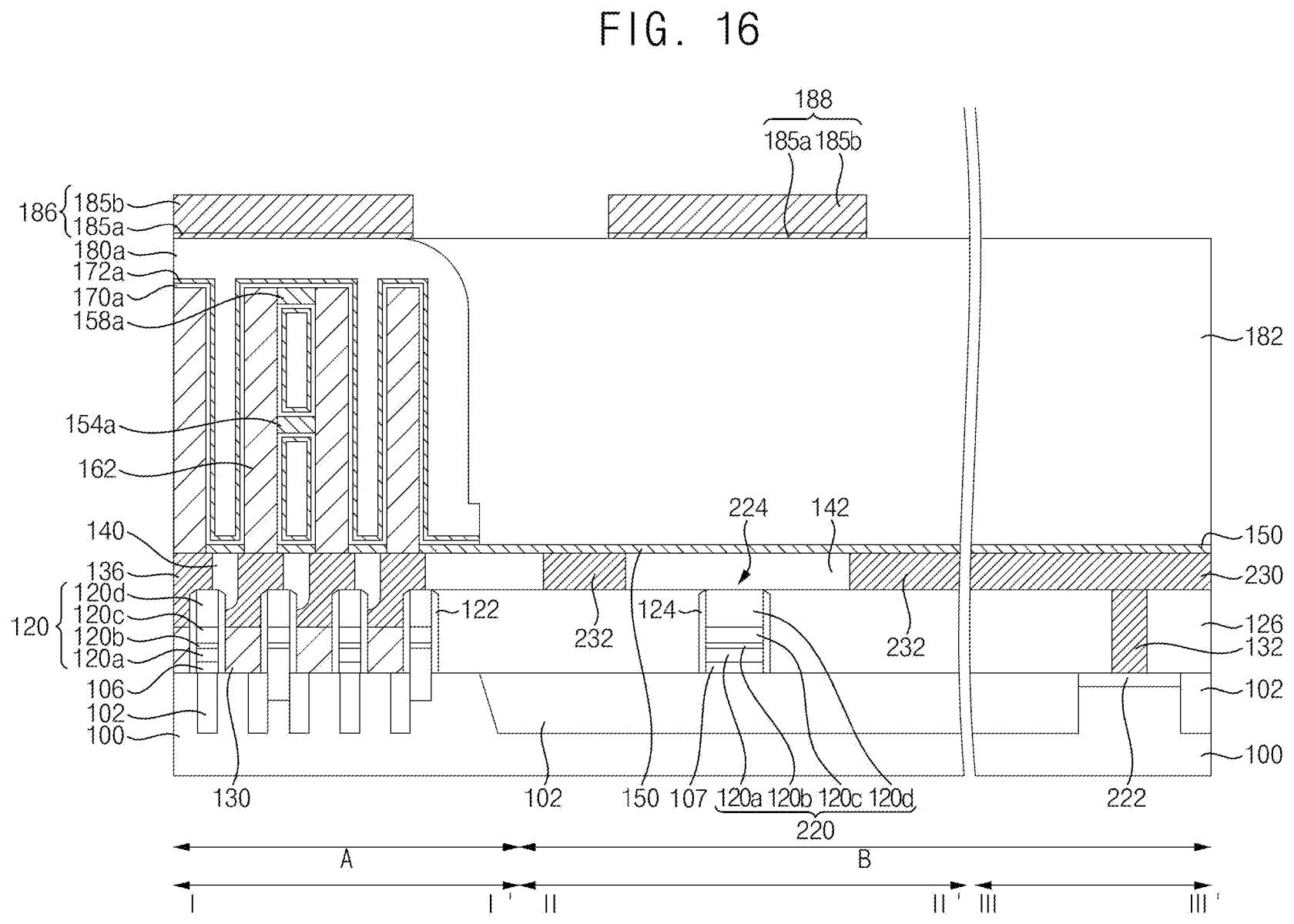
Figure 17:
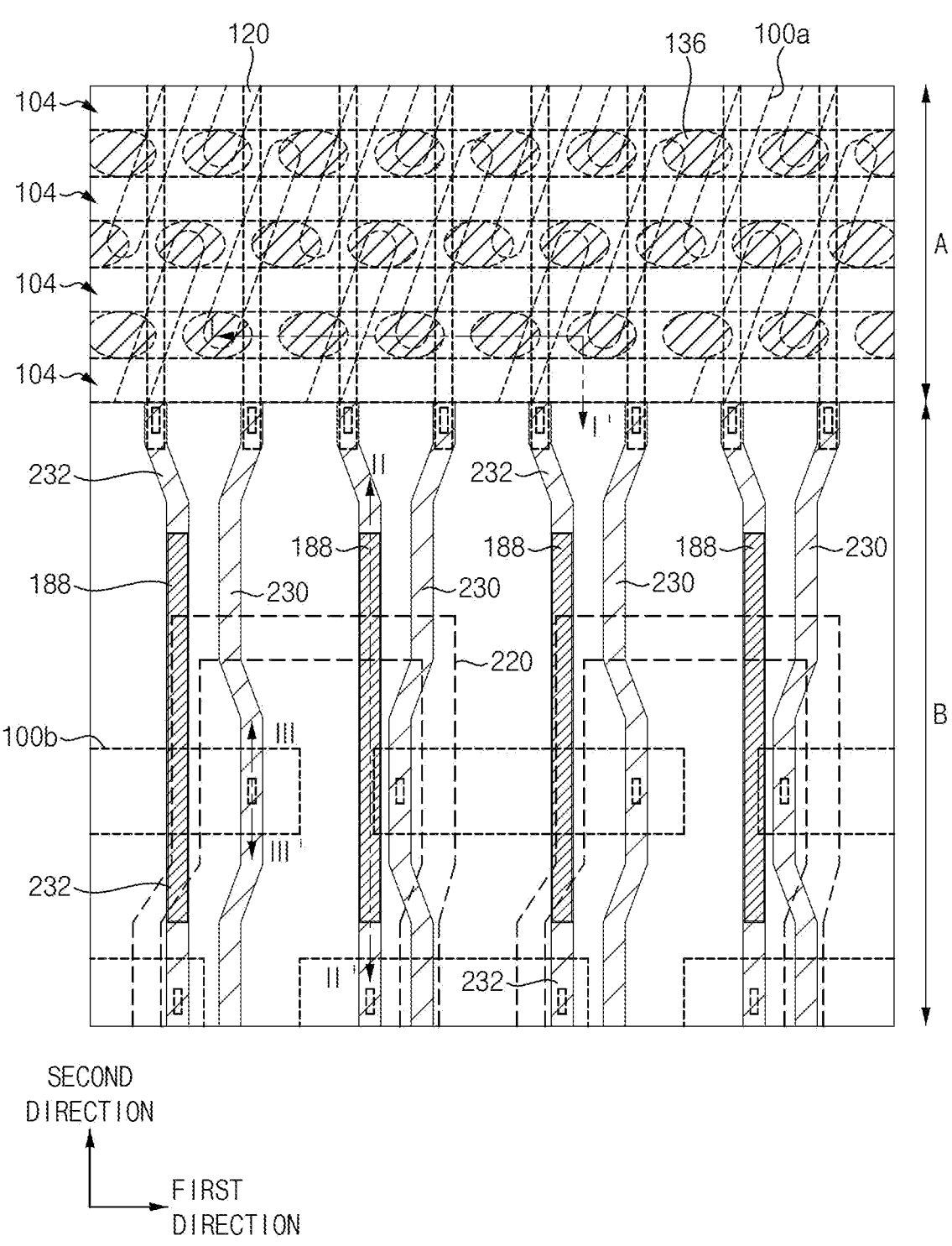

Referring to FIGS. 16 and 17, the third conductive layer 184 may be patterned to form a second plate pattern 186 to cover the upper surface of the first portion of the first plate pattern 180*a* in the cell region A. Further, a third connection line 188 may be formed on (e.g., formed directly thereon) the second insulating interlayer pattern 182 in the peripheral circuit region B. In an embodiment, the second plate pattern 186 and the third connection line 188 may be formed by the same patterning process. Accordingly, additional processes for forming the third connection line 188 may not be required and the processes for manufacturing may be simplified.

In an embodiment, each of the second plate pattern 186 and the third connection line 188 may include a second barrier metal pattern 185*a* and a second metal pattern 185*b*.

The third connection line 188 may be formed to face the cutting portion where the second connection lines 232 in the first connection line group are not formed. The third connection line 188 is disposed to face a portion between two second connection lines 232 and may overlap the cutting portion (e.g., in the vertical direction). Both ends of the third connection line 188 may overlap (e.g., in the vertical direction) with opposite ends of the two second connection lines 232, respectively.

Figure 18:
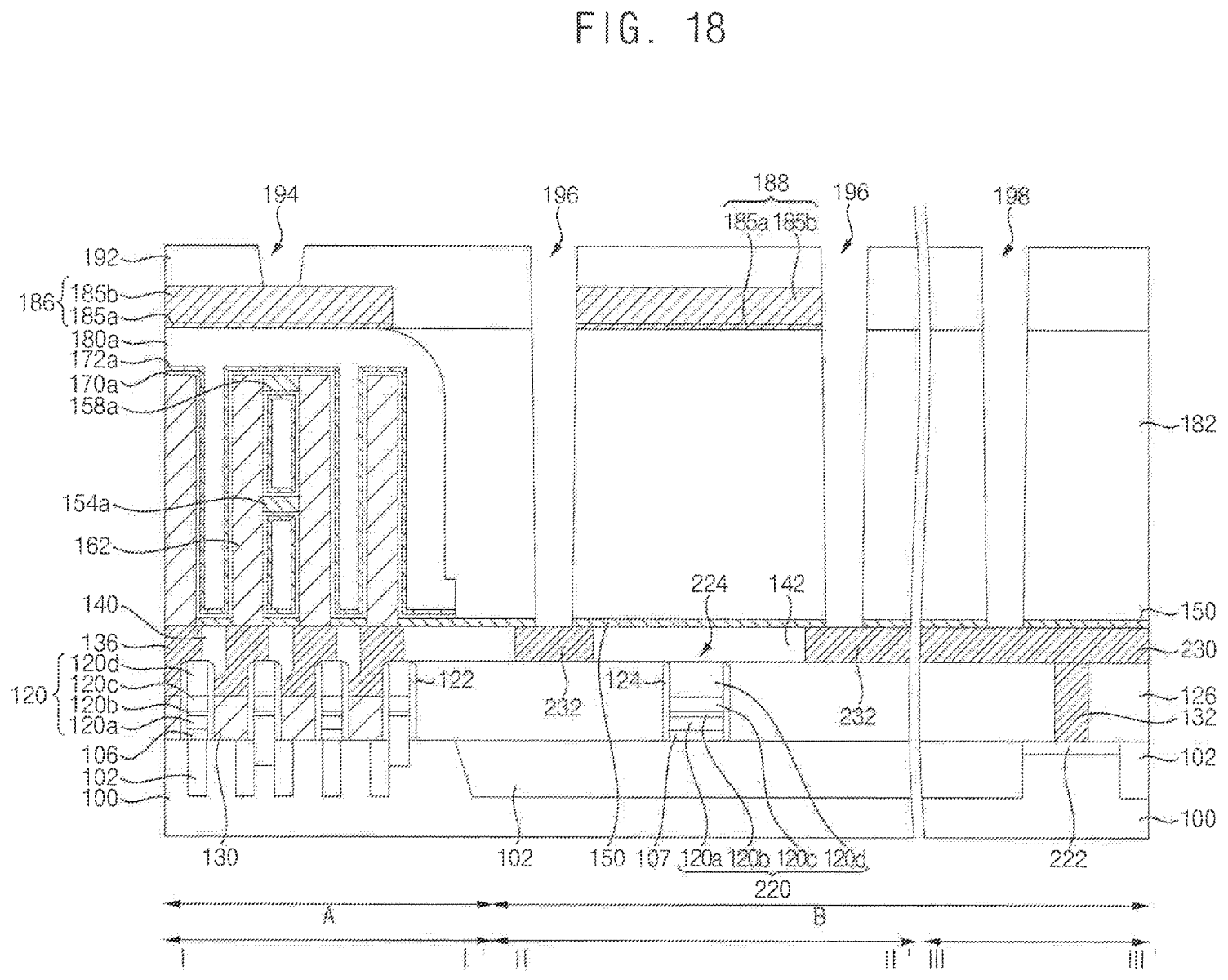

Referring to FIG. 18, a third insulating interlayer 192 may be formed on (e.g., formed directly thereon) the second plate pattern 186, the third connection line 188 and the second insulating interlayer pattern 182. In an embodiment, the third insulating interlayer 192 may include silicon oxide. However, embodiments of the present disclosure are not necessarily limited thereto.

A portion of the third insulating interlayer 192 may be etched to form a second contact hole 194 exposing the second plate pattern 186. In addition, the third insulating interlayer 192, the second insulating interlayer pattern 182 and the etch stop layer 150 may be etched to form a third contact hole 196 exposing the upper surface of the second connection line 232 and a fourth contact hole 198 exposing the upper surface of the first connection line 230.

Sidewalls of the third contact holes 196 may expose sidewalls of the third connection lines 188, respectively. For example, one third contact hole 196 may expose a first sidewall of the third connection line 188 and an adjacent third contact hole 196 may expose an opposite second sidewall of the third connection line 188. The third contact holes 196 may extend through while exposing both sidewalls of the third connection line 188, respectively. In an embodiment, the second to fourth contact holes 194, 196 and 198 may be formed by the same etching process.

Figure 19:
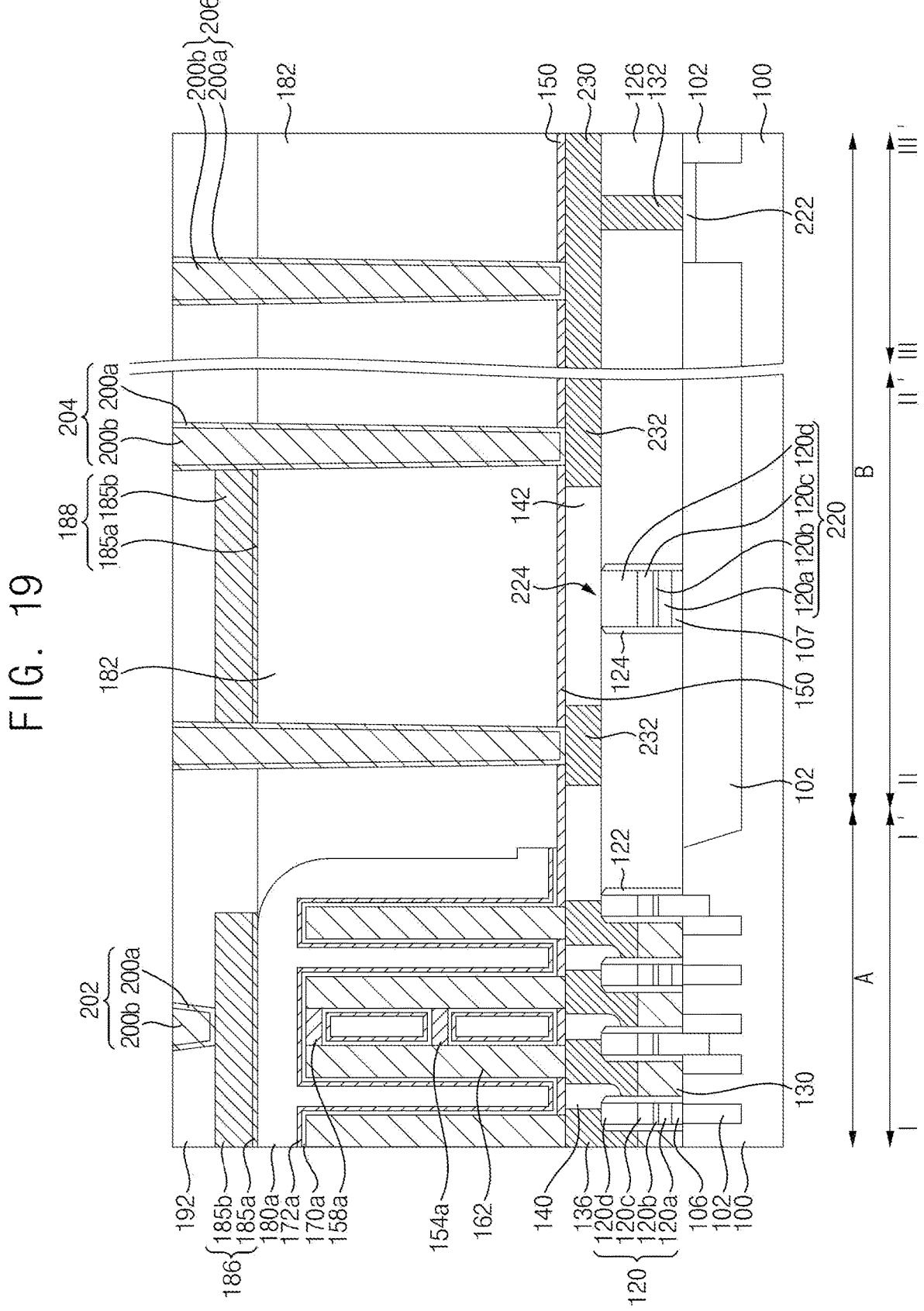
Figure 20:
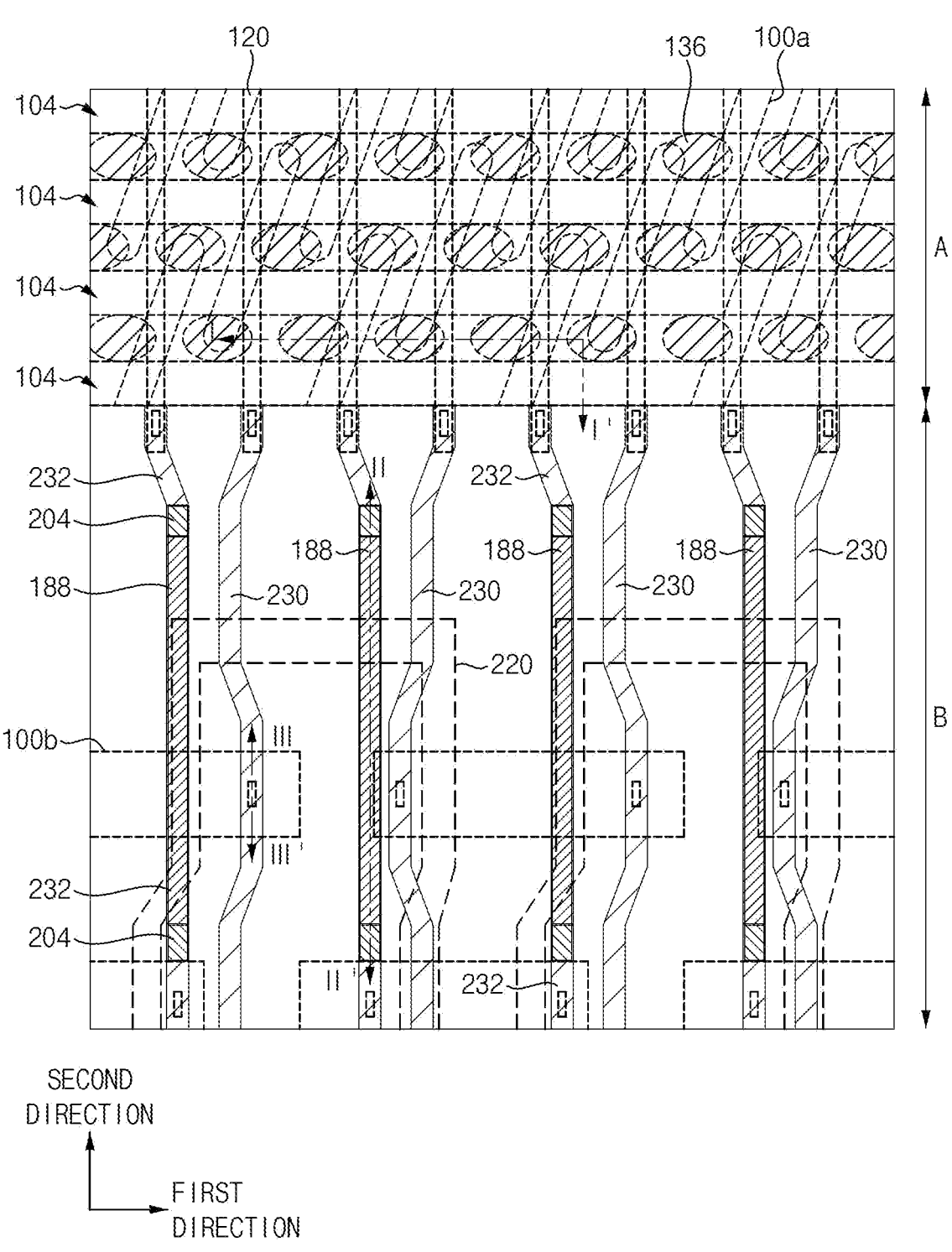

Referring to FIGS. 19 and 20, a fourth conductive layer may be formed on the third insulating interlayer 192 to fill the second to fourth contact holes 194, 196 and 198. The fourth conductive layer may be planarized until an upper surface of the third insulating interlayer 192 may be exposed to form a first contact plug 202 filling the second contact hole 194, a second contact plug 204 filling the third contact hole 196, and a third contact plug 206 filling the fourth contact hole 198.

In an embodiment, the first to third contact plugs 202, 204 and 206 are formed by the same processes, so that the first to third contact plugs 202, 204 and 206 may include the same material as each other. In an embodiment, the first to third contact plugs 202, 204 and 206 may include a third barrier metal pattern 200*a* and a third metal pattern 200*b*.

As shown in FIGS. 19 and 20, the second contact plugs 204 may directly contact both sidewalls of the third connection line 188, respectively. Accordingly, the second contact plug 204 may electrically connect the second connection lines 232 and the third connection line 188 to each other.

Figure 21:
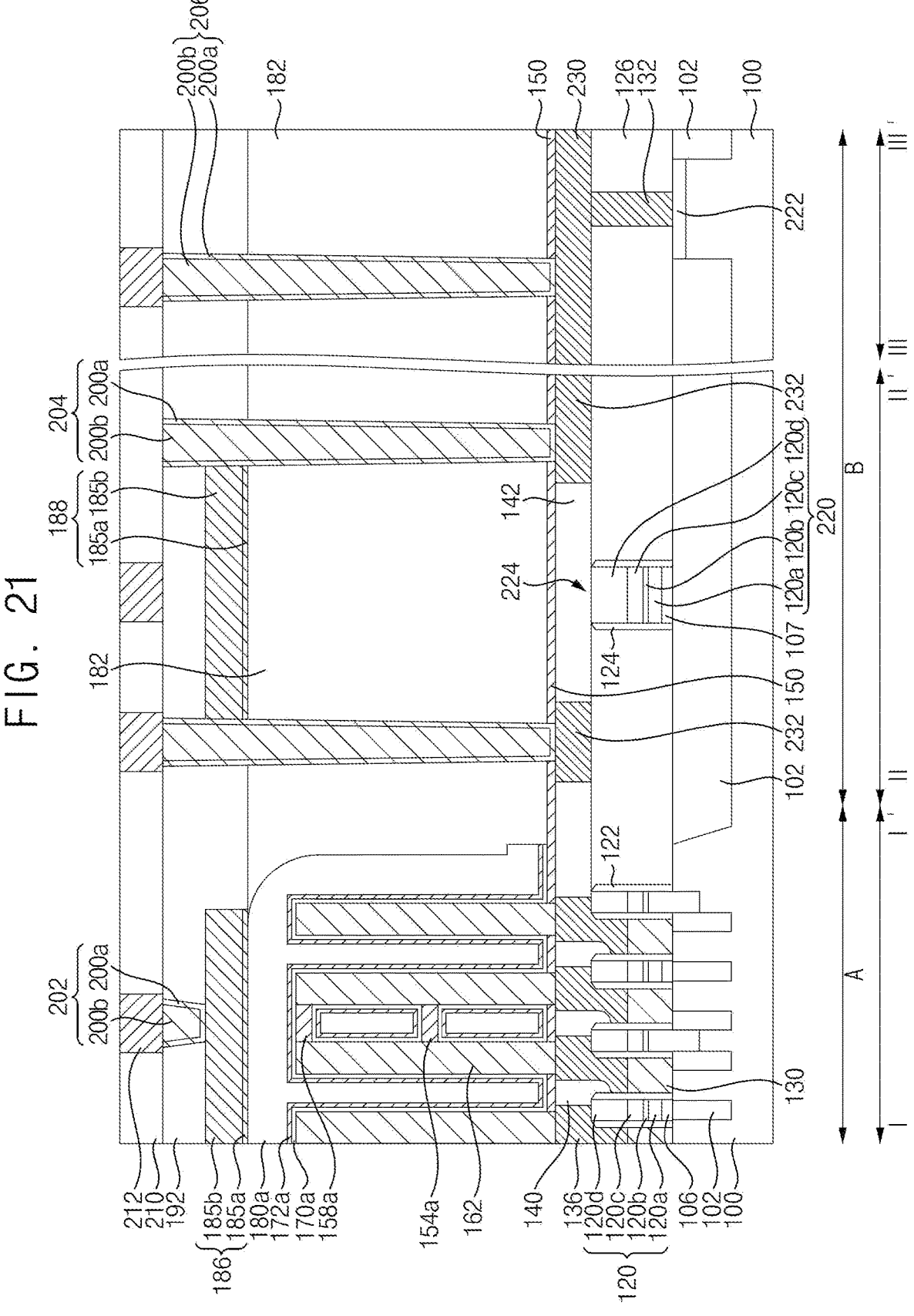

Referring to FIG. 21, a fourth insulating interlayer 210 may be formed on the third insulating interlayer 192 and the first to third contact plugs 202, 204 and 206.

A portion of the fourth insulating interlayer 210 may be etched to form openings. A fifth conductive layer may be formed to fill the openings. The fifth conductive layer may be planarized until an upper surface of the fourth insulating interlayer 210 may be exposed to form first upper conductive patterns 212. Each of the first upper conductive patterns 212 may directly contact one of upper surfaces of the first contact plug 202, the second contact plug 204 and the third contact plug 206.

In an embodiment, the first upper conductive pattern 212 may include copper. However, embodiments of the present disclosure are not necessarily limited thereto.

Figure 22:
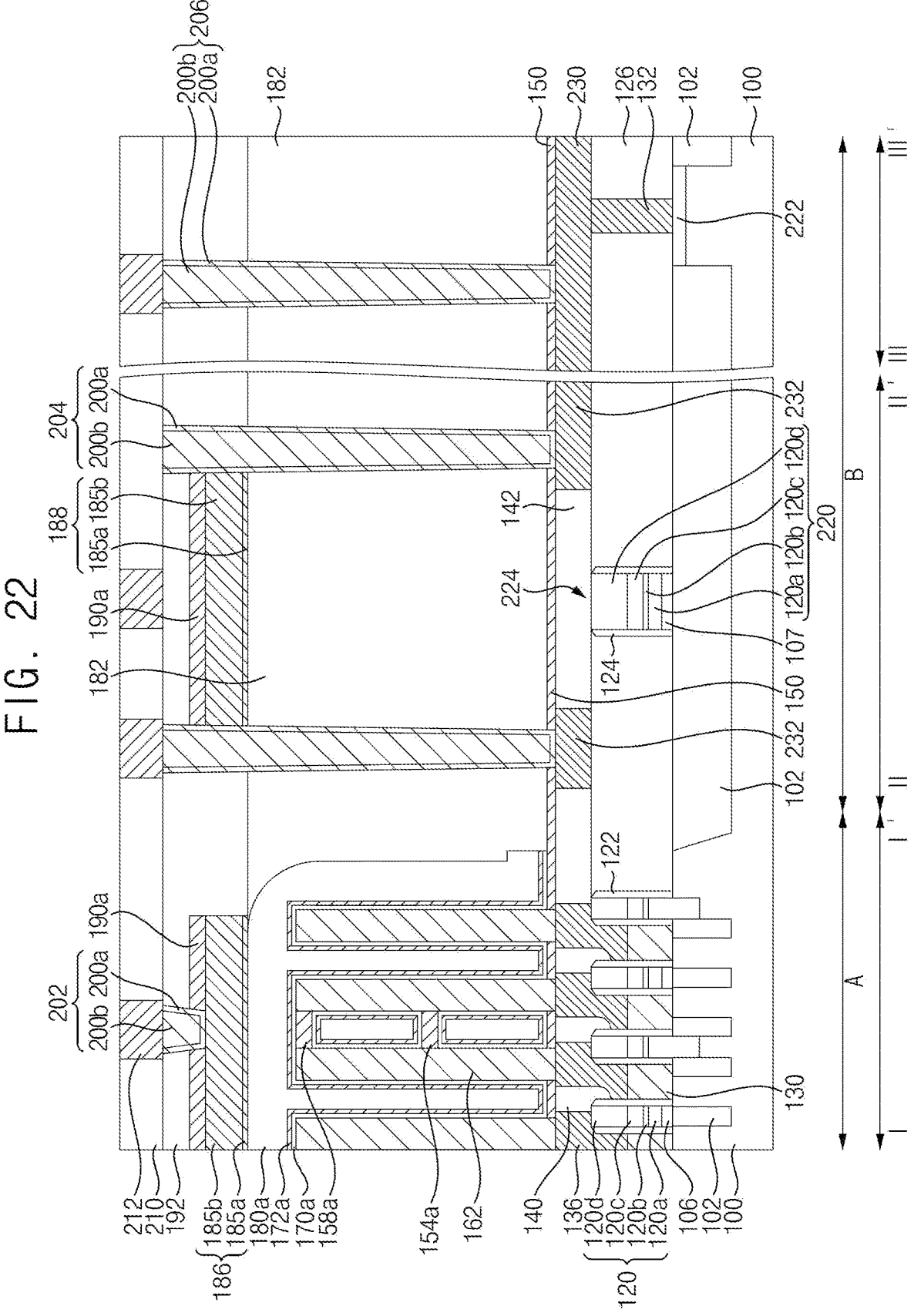

FIG. 22 is a cross-sectional view of a DRAM device according to an embodiment.

The DRAM device shown in FIG. 22 may have a structure the same as a structure of the DRAM device shown in FIG. 1, except that an upper mask pattern are formed on each of the second plate pattern and the third connection line. Therefore, redundant descriptions may be omitted.

Referring to FIG. 22, in an embodiment an upper mask pattern 190*a* may be formed on each of the second plate pattern 186 and the third connection line 188. In an embodiment, the upper mask pattern 190*a* may include silicon oxynitride, silicon nitride, SiCN, or the like. However, embodiments of the present disclosure are not necessarily limited thereto. The upper mask pattern 190*a* may serve as a metal diffusion barrier layer and an etch stop layer.

Figure 23:
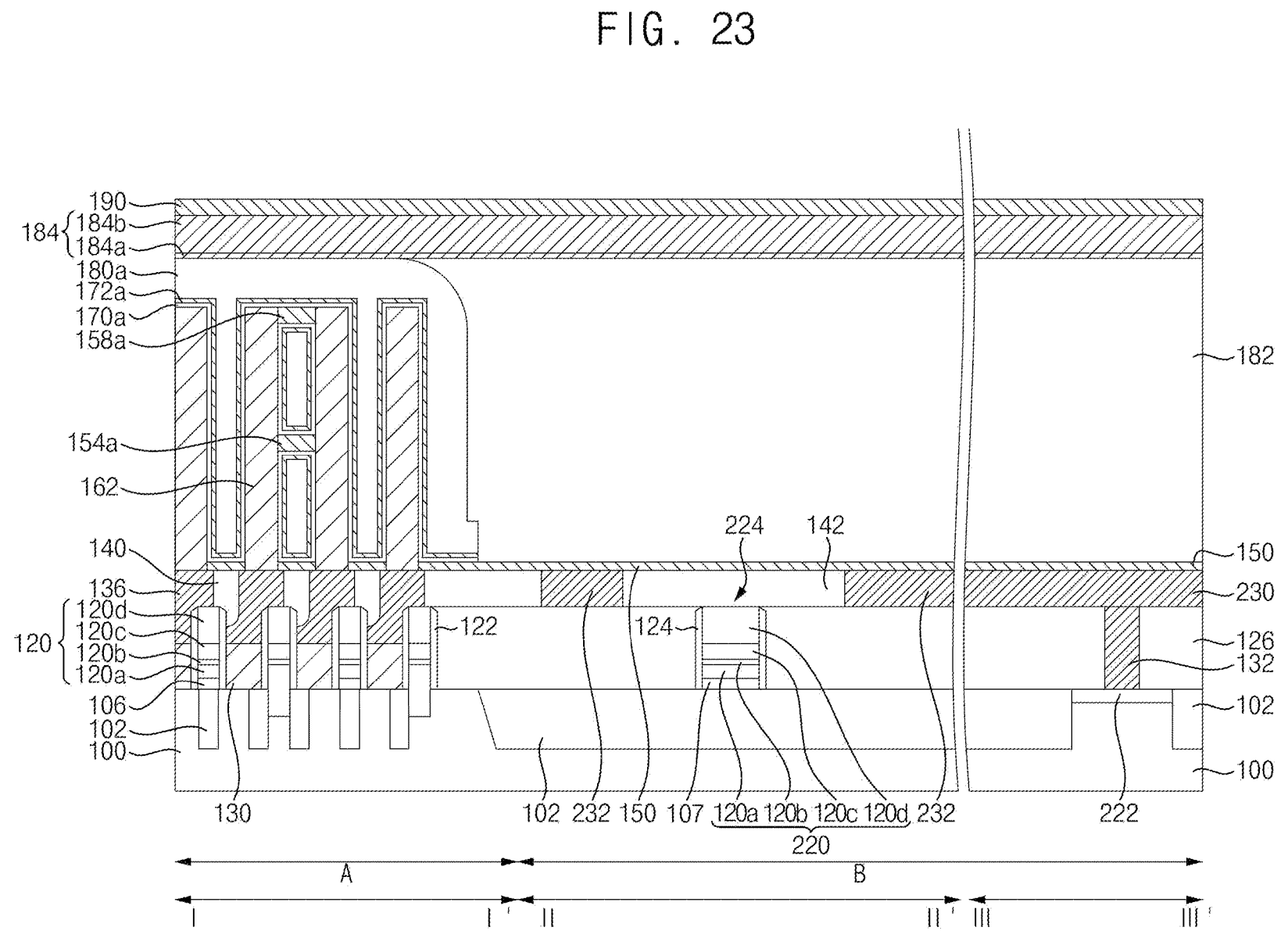
Figure 24:
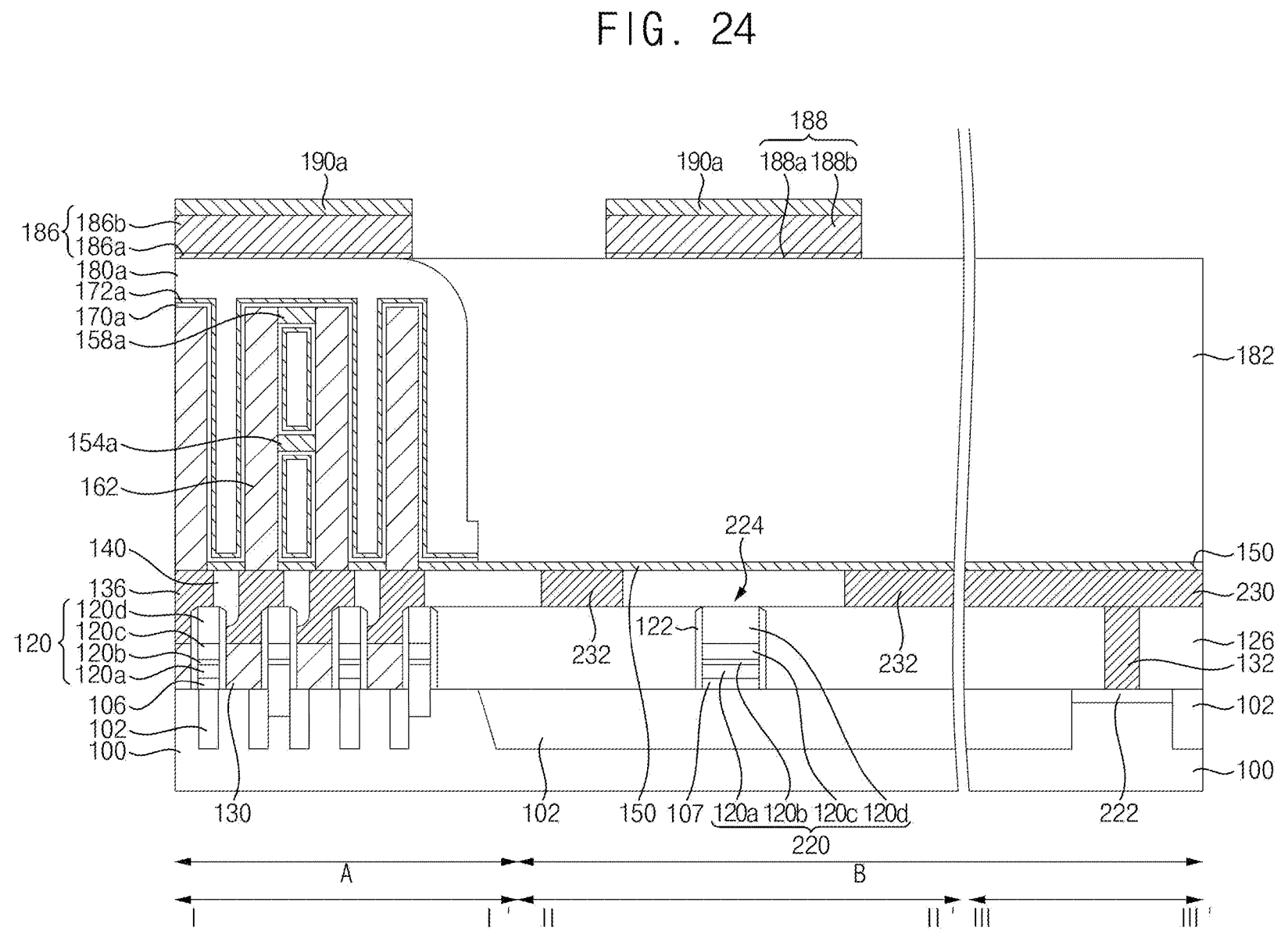
Figure 25:
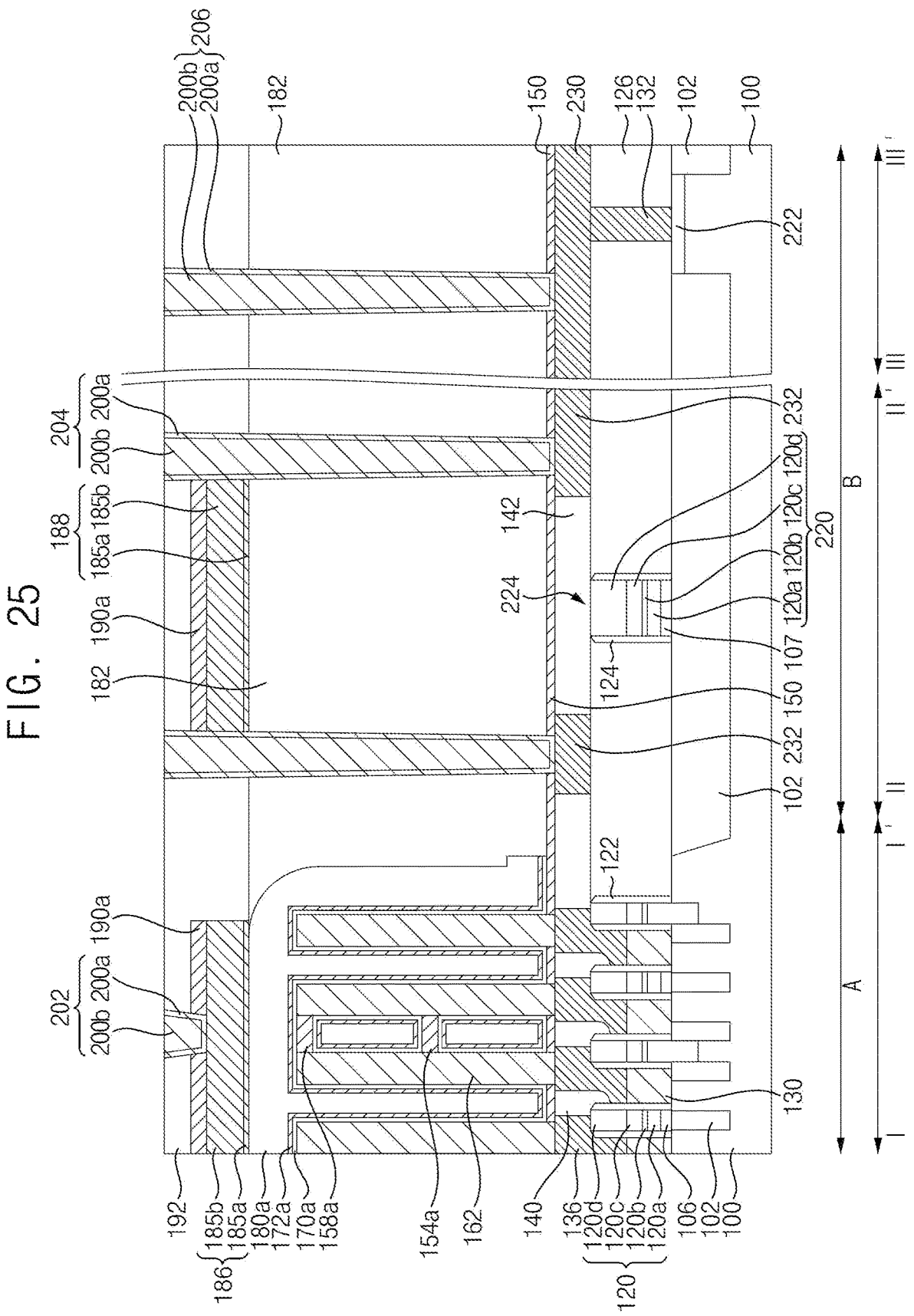

FIGS. 23 to 25 are cross-sectional views illustrating a method for manufacturing a DRAM device according to embodiments of the present disclosure.

Referring to FIG. 23, first, the processes as described with reference to FIGS. 1 to 15 may be performed. An upper mask layer 190 may then be formed on the third conductive layer 184. In an embodiment, the upper mask layer 190 may include silicon oxynitride, silicon nitride, SiCN, or the like. However, embodiments of the present disclosure are not necessarily limited thereto.

Referring to FIG. 24, the upper mask layer 190 and the third conductive layer 184 may be patterned to form a second plate pattern 186 and an upper mask pattern 190*a* covering an upper surface of the first portion of the first plate pattern 180*a* in the cell region A. Further, a third connection line 188 and an upper mask pattern 190*a* may be formed on the second insulating interlayer pattern 182 in the peripheral circuit region B.

Referring to FIG. 25, a third insulating interlayer 192 may be formed on (e.g., formed directly thereon) the upper mask pattern 190*a* and the second insulating interlayer pattern 182. The third insulating interlayer 192 and the upper mask pattern 190*a* may be partially etched to form a second contact hole exposing the second plate pattern 186. Further, the third insulating interlayer 192, the second insulating interlayer pattern 182 and the etch stop layer 150 may be etched to form a third contact hole exposing the upper surface of the second connection line 232 and a fourth contact hole exposing the upper surface of the first connection line 230.

First to third contact plugs 202, 204 and 206 may be formed in the second to fourth contact holes, respectively. The first to third contact plugs 202, 204, and 206 may be formed by the same processes as that described with reference to FIGS. 19 and 20.

Thereafter, the same processes as described with reference to FIG. 21 may be performed to manufacture the DRAM device shown in FIG. 22.

While the present disclosure has been shown and described with reference to non-limiting embodiments thereof, it will be understood by those of ordinary skill in the art that various changes in form and details may be made thereto without departing from the spirit and scope of the present disclosure.

What is claimed is:

1. A semiconductor device, comprising:
a substrate including a cell region and a peripheral circuit region;
a peripheral circuit transistor disposed in the peripheral circuit region;
first connection lines and second connection lines disposed on a same plane above the peripheral circuit transistor, the second connection lines including a cutting portion;
a cell capacitor disposed on the substrate in the cell region, and the cell capacitor including a lower electrode, a dielectric layer, and an upper electrode;
a first plate pattern on an upper electrode of the cell capacitor;
a second plate pattern on a portion of a surface of the first plate pattern;
a first contact plug directly contacting an upper surface of the second plate pattern;
a third connection line disposed above the second connection line, the third connection line facing the cutting portion; and
second contact plugs extending vertically to directly contact both sidewalls of the third connection line and upper surfaces of the second connection lines, the second contact plugs electrically connecting the second connection lines and the third connection line to each other,
wherein the third connection line is disposed on the same plane as the second plate pattern.

2. The semiconductor device of claim 1, wherein the first plate pattern includes a first portion in the cell region, the first portion having a flat upper surface disposed directly on the upper electrode, a second portion positioned at an edge portion of the cell region adjacent to the peripheral circuit region, the second portion having a vertical upper surface that is perpendicular to a surface of the substrate, and a third portion directly connected to the second portion and having a flat upper surface.

3. The semiconductor device of claim 2, wherein the second plate pattern is disposed directly on the first portion of the first plate pattern.

4. The semiconductor device of claim 1, wherein the second plate pattern and the third connection line include a same metal.

5. The semiconductor device of claim 1, wherein the first contact plug and the second contact plugs include a same metal.

6. The semiconductor device of claim 1, wherein the first plate pattern includes silicon germanium.

7. The semiconductor device of claim 1, wherein the second plate pattern includes tungsten.

8. The semiconductor device of claim 1, wherein upper surfaces of the first and second contact plugs are coplanar with each other in a vertical direction.

9. The semiconductor device of claim 1, further comprising a third contact plug contacting an upper surface of the first connection line.

10. The semiconductor device of claim 1, further comprising bit line structures on the substrate of the cell region, wherein the first connection lines and the second connection lines are electrically connected to the bit line structures, respectively.

11. A semiconductor device, comprising:
a substrate including a cell region and a peripheral circuit region;
bit line structures disposed on the substrate of the cell region;
a lower contact structure disposed between the bit line structures, the lower contact structure including a lower contact plug and a landing pad stacked thereon;
peripheral circuit transistors disposed in the peripheral circuit region;
first connection lines and second connection lines disposed on a same plane above the peripheral circuit transistors, the second connection lines including a cutting portion;
a cell capacitor disposed on the landing pad, the cell capacitor including a lower electrode, a dielectric layer, and an upper electrode;
a first plate pattern on an upper electrode of the cell capacitor;
a second plate pattern on the first plate pattern, wherein an entirety of a lower surface of the second plate pattern is higher than an uppermost surface of the upper electrode;
a first contact plug directly contacting an upper surface of the second plate pattern;
a third connection line disposed above the second connection line, the third connection line facing the cutting portion; and
second contact plugs extending vertically to directly contact both sidewalls of the third connection line and upper surfaces of the second connection lines, the second contact plugs electrically connecting the second connection lines and the third connection line to each other,
wherein a bottom surface of the third connection line is coplanar with a bottom surface of the second plate pattern in a vertical direction.

12. The semiconductor device of claim 11, wherein the first plate pattern includes a first portion, the first portion having a flat upper surface disposed directly on the upper electrode, a second portion positioned at an edge portion of the cell region adjacent to the peripheral circuit region, the second portion having a vertical upper surface that is perpendicular to a surface of the substrate, and a third portion directly connected to the second portion and having a flat upper surface.

13. The semiconductor device of claim 12, wherein the second plate pattern is disposed directly on the first portion of the first plate pattern.

14. The semiconductor device of claim 11, wherein the second plate pattern and the third connection line include a same metal.

15. The semiconductor device of claim 11, wherein each of the first and second connection lines are directly connected to an end of one of the bit line structures.

16. The semiconductor device of claim 15, wherein the first and second connection lines directly connected to ends of the bit line structures are alternately and repeatedly disposed.

17. The semiconductor device of claim 11, wherein each of the first connection lines is directly connected to the bit line structures and the peripheral circuit transistors, and the second connection lines are electrically connected to the bit line structures and the peripheral circuit transistors via the second contact plugs and third connection lines.

18. The semiconductor device of claim 11, wherein upper surfaces of the landing pad and the first and second connection lines are coplanar with each other in a vertical direction.

19. A semiconductor device, comprising:

a substrate including a cell region and a peripheral circuit region;

peripheral circuit transistors disposed in the peripheral circuit region;

first connection lines disposed on a same plane above the peripheral circuit transistors, the first connection lines including a cutting portion;

a cell capacitor disposed on the substrate of the cell region, the cell capacitor including a lower electrode, a dielectric layer, and an upper electrode;

a plate pattern on an upper electrode of the cell capacitor, wherein an entirety of a lower surface of the plate pattern is higher than an uppermost surface of the upper electrode;

a first contact plug directly contacting an upper surface of the plate pattern;

a second connection line facing the cutting portion, the second connection line positioned on a same plane as the plate pattern in a vertical direction; and second contact plugs extending to directly contact both sidewalls of the second connection line and upper surfaces of the first connection lines, the second contact plugs are electrically connected to the first connection lines and the second connection line.

20. The semiconductor device of claim 19, wherein the plate pattern and the second connection line include a same metal.

\* \* \* \* \*